United States Patent
Lee et al.

(10) Patent No.: US 8,125,064 B1
(45) Date of Patent: Feb. 28, 2012

(54) INCREASED I/O SEMICONDUCTOR PACKAGE AND METHOD OF MAKING SAME

(75) Inventors: Chang Deok Lee, Uijeongbu-si (KR);
Do Hyun Na, Dongjak-gu (KR)

(73) Assignee: Amkor Technology, Inc., Chandler, AZ (US)

( * ) Notice: Subject to any disclaimer, the term of this patent is extended or adjusted under 35 U.S.C. 154(b) by 681 days.

(21) Appl. No.: 12/181,256

(22) Filed: Jul. 28, 2008

(51) Int. Cl.
*H01L 23/06* (2006.01)

(52) U.S. Cl. ........... 257/684; 257/E23.067; 257/698; 257/700; 438/106; 438/121

(58) Field of Classification Search ........... 257/E23.006, 257/E23.065, 684, 698, 699, 700, 701, 708, 257/729, 730, 738, 787, 790, E23.067; 438/106, 438/121, 127, 667, 758
See application file for complete search history.

(56) References Cited

U.S. PATENT DOCUMENTS 2,596,993 A    5/1952  Gookin
(Continued)

FOREIGN PATENT DOCUMENTS

DE    19734794 A1    8/1997
(Continued)

OTHER PUBLICATIONS

National Semiconductor Corporation, "Leadless Leadframe Package," Informational Pamphlet from webpage, 21 pages, Oct. 2002, www.national.com.
(Continued)

*Primary Examiner* — Chris Chu
(74) *Attorney, Agent, or Firm* — Stetina Brunda Garred & Brucker

(57) ABSTRACT

In accordance with the present invention, there is provided a semiconductor package and a fabrication method thereof. The semiconductor package is provided with a substrate made of metal, thereby improving efficiency of thermal emission from a semiconductor die mounted to the substrate, and simplifying the fabrication process for the substrate which reduces fabricating costs. Further, unlike a conventional land, a rivet electrically insulated with the substrate is inserted into a corresponding hole of the substrate, the upper and lower surfaces of the rivet being removed to form land, thereby simplifying the fabrication process for the substrate which further reduces fabricating costs.

20 Claims, 19 Drawing Sheets

U.S. PATENT DOCUMENTS

| | | | |
|---|---|---|---|
| 3,435,815 A | 4/1969 | Forcier | |
| 3,734,660 A | 5/1973 | Davies et al. | |
| 3,838,984 A | 10/1974 | Crane et al. | |
| 4,054,238 A | 10/1977 | Lloyd et al. | |
| 4,189,342 A | 2/1980 | Kock | |
| 4,221,925 A | 9/1980 | Finley et al. | |
| 4,258,381 A | 3/1981 | Inaba | |
| 4,289,922 A | 9/1981 | Devlin | |
| 4,301,464 A | 11/1981 | Otsuki et al. | |
| 4,332,537 A | 6/1982 | Slepcevic | |
| 4,417,266 A | 11/1983 | Grabbe | |
| 4,451,224 A | 5/1984 | Harding | |
| 4,530,152 A | 7/1985 | Roche et al. | |
| 4,541,003 A | 9/1985 | Otsuka et al. | |
| 4,646,710 A | 3/1987 | Schmid et al. | |
| 4,707,724 A | 11/1987 | Suzuki et al. | |
| 4,727,633 A | 3/1988 | Herrick | |
| 4,737,839 A | 4/1988 | Burt | |
| 4,756,080 A | 7/1988 | Thorp, Jr. et al. | |
| 4,812,896 A | 3/1989 | Rothgery et al. | |
| 4,862,245 A | 8/1989 | Pashby et al. | |
| 4,862,246 A | 8/1989 | Masuda et al. | |
| 4,907,067 A | 3/1990 | Derryberry | |
| 4,920,074 A | 4/1990 | Shimizu et al. | |
| 4,935,803 A | 6/1990 | Kalfus et al. | |
| 4,942,454 A | 7/1990 | Mori et al. | |
| 4,987,475 A | 1/1991 | Sclesinger et al. | |
| 5,018,003 A | 5/1991 | Yasunaga | |
| 5,029,386 A | 7/1991 | Chao et al. | |
| 5,041,902 A | 8/1991 | McShane | |
| 5,057,900 A | 10/1991 | Yamazaki | |
| 5,059,379 A | 10/1991 | Tsutsumi et al. | |
| 5,065,223 A | 11/1991 | Matsuki et al. | |
| 5,070,039 A | 12/1991 | Johnson et al. | |
| 5,087,961 A | 2/1992 | Long et al. | |
| 5,091,341 A | 2/1992 | Asada et al. | |
| 5,096,852 A | 3/1992 | Hobson et al. | |
| 5,118,298 A | 6/1992 | Murphy | |
| 5,122,860 A | 6/1992 | Kichuchi et al. | |
| 5,134,773 A | 8/1992 | LeMaire et al. | |
| 5,151,039 A | 9/1992 | Murphy | |
| 5,157,475 A | 10/1992 | Yamaguchi | |
| 5,157,480 A | 10/1992 | McShane et al. | |
| 5,168,368 A | 12/1992 | Gow, 3rd et al. | |
| 5,172,213 A | 12/1992 | Zimmerman | |
| 5,172,214 A | 12/1992 | Casto | |
| 5,175,060 A | 12/1992 | Enomoto et al. | |
| 5,200,362 A | 4/1993 | Lin et al. | |
| 5,200,809 A | 4/1993 | Kwon | |
| 5,214,845 A | 6/1993 | King et al. | |
| 5,216,278 A | 6/1993 | Lin et al. | |
| 5,218,231 A | 6/1993 | Kudo | |
| 5,221,642 A | 6/1993 | Burns | |
| 5,250,841 A | 10/1993 | Sloan et al. | |
| 5,252,853 A | 10/1993 | Michii | |
| 5,258,094 A | 11/1993 | Furui et al. | |
| 5,266,834 A | 11/1993 | Nishi et al. | |
| 5,273,938 A | 12/1993 | Lin et al. | |
| 5,277,972 A | 1/1994 | Sakumoto et al. | |
| 5,278,446 A | 1/1994 | Nagaraj et al. | |
| 5,279,029 A | 1/1994 | Burns | |
| 5,281,849 A | 1/1994 | Singh Deo et al. | |
| 5,285,352 A | 2/1994 | Pastore et al. | |
| 5,294,897 A | 3/1994 | Notani et al. | |
| 5,327,008 A | 7/1994 | Djennas et al. | |
| 5,332,864 A | 7/1994 | Liang et al. | |
| 5,335,771 A | 8/1994 | Murphy | |
| 5,336,931 A | 8/1994 | Juskey et al. | |
| 5,343,076 A | 8/1994 | Katayama et al. | |
| 5,358,905 A | 10/1994 | Chiu | |
| 5,365,106 A | 11/1994 | Watanabe | |
| 5,381,042 A | 1/1995 | Lerner et al. | |
| 5,391,439 A | 2/1995 | Tomita et al. | |
| 5,397,917 A * | 3/1995 | Ommen et al. | 257/698 |
| 5,406,124 A | 4/1995 | Morita et al. | |
| 5,410,180 A | 4/1995 | Fujii et al. | |
| 5,414,299 A | 5/1995 | Wang et al. | |
| 5,417,905 A | 5/1995 | LeMaire et al. | |
| 5,424,576 A | 6/1995 | Djennas et al. | |
| 5,428,248 A | 6/1995 | Cha | |
| 5,435,057 A | 7/1995 | Bindra et al. | |
| 5,444,301 A | 8/1995 | Song et al. | |
| 5,452,511 A | 9/1995 | Chang | |
| 5,454,905 A | 10/1995 | Fogelson | |
| 5,467,032 A | 11/1995 | Lee | |
| 5,474,958 A | 12/1995 | Djennas et al. | |
| 5,484,274 A | 1/1996 | Neu | |
| 5,493,151 A | 2/1996 | Asada et al. | |
| 5,508,556 A | 4/1996 | Lin | |
| 5,517,056 A | 5/1996 | Bigler et al. | |
| 5,521,429 A | 5/1996 | Aono et al. | |
| 5,528,076 A | 6/1996 | Pavio | |
| 5,534,467 A | 7/1996 | Rostoker | |
| 5,539,251 A | 7/1996 | Iverson et al. | |
| 5,543,657 A | 8/1996 | Diffenderfer et al. | |
| 5,544,412 A | 8/1996 | Romero et al. | |
| 5,545,923 A | 8/1996 | Barber | |
| 5,581,122 A | 12/1996 | Chao et al. | |
| 5,592,019 A | 1/1997 | Ueda et al. | |
| 5,592,025 A | 1/1997 | Clark et al. | |
| 5,594,274 A | 1/1997 | Suetaki | |
| 5,595,934 A | 1/1997 | Kim | |
| 5,604,376 A | 2/1997 | Hamburgen et al. | |
| 5,608,265 A | 3/1997 | Kitano et al. | |
| 5,608,267 A | 3/1997 | Mahulikar et al. | |
| 5,625,222 A | 4/1997 | Yoneda et al. | |
| 5,633,528 A | 5/1997 | Abbott et al. | |
| 5,637,922 A | 6/1997 | Fillion et al. | |
| 5,639,990 A | 6/1997 | Nishihara et al. | |
| 5,640,047 A | 6/1997 | Nakashima | |
| 5,641,997 A | 6/1997 | Ohta et al. | |
| 5,643,433 A | 7/1997 | Fukase et al. | |
| 5,644,169 A | 7/1997 | Chun | |
| 5,646,831 A | 7/1997 | Manteghi | |
| 5,650,663 A | 7/1997 | Parthasarathi | |
| 5,661,088 A | 8/1997 | Tessier et al. | |
| 5,665,996 A | 9/1997 | Williams et al. | |
| 5,673,479 A | 10/1997 | Hawthorne | |
| 5,683,806 A | 11/1997 | Sakumoto et al. | |
| 5,683,943 A | 11/1997 | Yamada | |
| 5,689,135 A | 11/1997 | Ball | |
| 5,696,666 A | 12/1997 | Miles et al. | |
| 5,701,034 A | 12/1997 | Marrs | |
| 5,703,407 A | 12/1997 | Hori | |
| 5,710,064 A | 1/1998 | Song et al. | |
| 5,723,899 A | 3/1998 | Shin | |
| 5,724,233 A | 3/1998 | Honda et al. | |
| 5,726,493 A | 3/1998 | Yamashita | |
| 5,736,432 A | 4/1998 | Mackessy | |
| 5,745,984 A | 5/1998 | Cole, Jr. et al. | |
| 5,753,532 A | 5/1998 | Sim | |
| 5,753,977 A | 5/1998 | Kusaka et al. | |
| 5,766,972 A | 6/1998 | Takahashi et al. | |
| 5,770,888 A | 6/1998 | Song et al. | |
| 5,776,798 A | 7/1998 | Quan et al. | |
| 5,783,861 A | 7/1998 | Son | |
| 5,801,440 A | 9/1998 | Chu et al. | |
| 5,814,877 A | 9/1998 | Diffenderfer et al. | |
| 5,814,881 A | 9/1998 | Alagaratnam et al. | |
| 5,814,883 A | 9/1998 | Sawai et al. | |
| 5,814,884 A | 9/1998 | Davis et al. | |
| 5,817,540 A | 10/1998 | Wark | |
| 5,818,105 A | 10/1998 | Kouda | |
| 5,821,457 A | 10/1998 | Mosley et al. | |
| 5,821,615 A | 10/1998 | Lee | |
| 5,834,830 A | 11/1998 | Cho | |
| 5,835,988 A | 11/1998 | Ishii | |
| 5,844,306 A | 12/1998 | Fujita et al. | |
| 5,854,512 A | 12/1998 | Manteghi | |
| 5,856,911 A | 1/1999 | Riley | |
| 5,859,471 A | 1/1999 | Kuraishi et al. | |
| 5,866,939 A | 2/1999 | Shin et al. | |
| 5,866,942 A | 2/1999 | Suzuki et al. | |
| 5,871,782 A | 2/1999 | Choi | |
| 5,874,784 A | 2/1999 | Aoki et al. | |
| 5,877,043 A | 3/1999 | Alcoe et al. | |
| 5,886,397 A | 3/1999 | Ewer | |

| | | |
|---|---|---|
| 5,973,935 A | 10/1999 | Schoenfeld et al. |
| 5,977,630 A | 11/1999 | Woodworth et al. |
| RE36,773 E | 7/2000 | Nomi et al. |
| 6,097,089 A * | 8/2000 | Gaku et al. .............. 257/712 |
| 6,107,679 A | 8/2000 | Noguchi |
| 6,143,981 A | 11/2000 | Glenn |
| 6,166,430 A | 12/2000 | Yamaguchi |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,184,573 B1 | 2/2001 | Pu |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | McClellan et al. |
| 6,229,205 B1 | 5/2001 | Jeong et al. |
| 6,239,367 B1 | 5/2001 | Hsuan et al. |
| 6,239,384 B1 | 5/2001 | Smith et al. |
| 6,242,281 B1 | 6/2001 | McClellan et al. |
| 6,256,200 B1 | 7/2001 | Lam et al. |
| 6,258,629 B1 | 7/2001 | Niones et al. |
| 6,281,566 B1 | 8/2001 | Magni |
| 6,282,094 B1 | 8/2001 | Lo et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,822 B1 | 11/2001 | Venkateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karmezos et al. |
| 6,335,564 B1 | 1/2002 | Pour |
| 6,337,510 B1 | 1/2002 | Chun-Jen et al. |
| 6,339,255 B1 | 1/2002 | Shin |
| 6,348,726 B1 | 2/2002 | Bayan et al. |
| 6,355,502 B1 | 3/2002 | Kang et al. |
| 6,359,221 B1 | 3/2002 | Yamada et al. |
| 6,362,525 B1 | 3/2002 | Rahim |
| 6,369,447 B2 | 4/2002 | Mori |
| 6,369,454 B1 | 4/2002 | Chung |
| 6,373,127 B1 | 4/2002 | Baudouin et al. |
| 6,376,908 B1 * | 4/2002 | Gaku et al. .............. 257/707 |
| 6,377,464 B1 | 4/2002 | Hashemi et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,399,415 B1 | 6/2002 | Bayan et al. |
| 6,400,004 B1 | 6/2002 | Fan et al. |
| 6,400,010 B1 * | 6/2002 | Murata .................. 257/706 |
| 6,410,979 B2 | 6/2002 | Abe |
| 6,414,385 B1 | 7/2002 | Huang et al. |
| 6,420,779 B1 | 7/2002 | Sharma et al. |
| 6,421,013 B1 | 7/2002 | Chung |
| 6,429,508 B1 | 8/2002 | Gang |
| 6,437,429 B1 | 8/2002 | Su et al. |
| 6,444,499 B1 | 9/2002 | Swiss et al. |
| 6,448,633 B1 | 9/2002 | Yee et al. |
| 6,452,279 B2 | 9/2002 | Shimoda |
| 6,459,148 B1 | 10/2002 | Chun-Jen et al. |
| 6,464,121 B2 | 10/2002 | Reijinders |
| 6,465,883 B2 | 10/2002 | Olofsson |
| 6,472,735 B2 | 10/2002 | Isaak |
| 6,475,646 B2 | 11/2002 | Park et al. |
| 6,476,469 B2 | 11/2002 | Hung et al. |
| 6,476,474 B1 | 11/2002 | Hung |
| 6,482,680 B1 | 11/2002 | Khor et al. |
| 6,483,178 B1 | 11/2002 | Chuang |
| 6,492,201 B1 * | 12/2002 | Haba .................. 438/121 |
| 6,492,718 B2 | 12/2002 | Ohmori |
| 6,498,099 B1 | 12/2002 | McClellan et al. |
| 6,498,392 B2 | 12/2002 | Azuma |
| 6,507,096 B2 | 1/2003 | Gang |
| 6,507,120 B2 | 1/2003 | Lo et al. |
| 6,518,089 B2 | 2/2003 | Coyle |
| 6,525,942 B2 | 2/2003 | Huang et al. |
| 6,534,849 B1 | 3/2003 | Gang |
| 6,545,332 B2 | 4/2003 | Huang |
| 6,545,345 B1 | 4/2003 | Glenn et al. |
| 6,552,421 B2 | 4/2003 | Kishimoto et al. |
| 6,559,525 B2 | 5/2003 | Huang |
| 6,566,168 B2 | 5/2003 | Gang |
| 6,580,161 B2 | 6/2003 | Kobayakawa |
| 6,583,503 B2 | 6/2003 | Akram et al. |
| 6,586,274 B2 * | 7/2003 | Murata .................. 438/106 |
| 6,603,196 B2 | 8/2003 | Lee et al. |
| 6,624,005 B1 | 9/2003 | DiCaprio et al. |
| 6,646,339 B1 | 11/2003 | Ku |
| 6,667,546 B2 | 12/2003 | Huang et al. |
| 6,677,663 B1 | 1/2004 | Ku et al. |
| 6,686,649 B1 | 2/2004 | Matthews et al. |
| 6,696,752 B2 | 2/2004 | Su et al. |
| 6,700,189 B2 | 3/2004 | Shibata |
| 6,713,375 B2 | 3/2004 | Shenoy |
| 6,757,178 B2 | 6/2004 | Okabe et al. |
| 6,800,936 B2 | 10/2004 | Kosemura et al. |
| 6,812,552 B2 | 11/2004 | Islam et al. |
| 6,828,224 B2 * | 12/2004 | Iijima et al. .................. 438/622 |
| 6,858,919 B2 | 2/2005 | Seo et al. |
| 6,867,492 B2 | 3/2005 | Auburger et al. |
| 6,878,571 B2 | 4/2005 | Isaak et al. |
| 6,897,552 B2 | 5/2005 | Nakao |
| 6,927,478 B2 | 8/2005 | Paek |
| 7,002,805 B2 | 2/2006 | Lee et al. |
| 7,005,327 B2 | 2/2006 | Kung et al. |
| 7,015,571 B2 | 3/2006 | Chang et al. |
| 7,053,469 B2 | 5/2006 | Koh et al. |
| 7,102,209 B1 | 9/2006 | Bayan et al. |
| 7,112,285 B2 * | 9/2006 | Chakravorty .................. 216/18 |
| 7,185,426 B1 | 3/2007 | Hiner et al. |
| 7,211,471 B1 | 5/2007 | Foster |
| 7,245,007 B1 | 7/2007 | Foster |
| 7,253,503 B1 | 8/2007 | Fusaro et al. |
| 7,528,476 B2 * | 5/2009 | Ito .................. 257/689 |
| 7,759,581 B2 * | 7/2010 | Nakasato et al. ........... 174/262 |
| 2001/0008305 A1 | 7/2001 | McClellan et al. |
| 2001/0014538 A1 | 8/2001 | Kwan et al. |
| 2002/0011654 A1 | 1/2002 | Kimura |
| 2002/0024122 A1 | 2/2002 | Jung et al. |
| 2002/0027297 A1 | 3/2002 | Ikenaga et al. |
| 2002/0038873 A1 | 4/2002 | Hiyoshi |
| 2002/0072147 A1 | 6/2002 | Sayanagi et al. |
| 2002/0111009 A1 | 8/2002 | Huang et al. |
| 2002/0140061 A1 | 10/2002 | Lee |
| 2002/0140068 A1 | 10/2002 | Lee et al. |
| 2002/0140081 A1 | 10/2002 | Chou et al. |
| 2002/0158318 A1 | 10/2002 | Chen |
| 2002/0163015 A1 | 11/2002 | Lee et al. |
| 2002/0167060 A1 | 11/2002 | Buijsman et al. |
| 2003/0006055 A1 | 1/2003 | Chien-Hung et al. |
| 2003/0030131 A1 | 2/2003 | Lee et al. |
| 2003/0059644 A1 | 3/2003 | Datta et al. |
| 2003/0064548 A1 | 4/2003 | Isaak |
| 2003/0073265 A1 | 4/2003 | Hu et al. |
| 2003/0102537 A1 | 6/2003 | McLellan et al. |
| 2003/0164554 A1 | 9/2003 | Fee et al. |

| | | | | | |
|---|---|---|---|---|---|
| 2003/0168719 A1 | 9/2003 | Cheng et al. | JP | 4098864 | 3/1992 |
| 2003/0198032 A1 | 10/2003 | Collander et al. | JP | 5129473 | 5/1993 |
| 2004/0027788 A1 | 2/2004 | Chiu et al. | JP | 5166992 | 7/1993 |
| 2004/0056277 A1 | 3/2004 | Karnezos | JP | 5283460 | 10/1993 |
| 2004/0061212 A1 | 4/2004 | Karnezos | JP | 6061401 | 3/1994 |
| 2004/0061213 A1 | 4/2004 | Karnezos | JP | 692076 | 4/1994 |
| 2004/0063242 A1 | 4/2004 | Karnezos | JP | 6140563 | 5/1994 |
| 2004/0063246 A1 | 4/2004 | Karnezos | JP | 6260532 | 9/1994 |
| 2004/0065963 A1 | 4/2004 | Karnezos | JP | 7297344 | 11/1995 |
| 2004/0080025 A1 | 4/2004 | Kasahara et al. | JP | 7312405 | 11/1995 |
| 2004/0089926 A1 | 5/2004 | Hsu et al. | JP | 8064634 | 3/1996 |
| 2004/0164387 A1 | 8/2004 | Ikenaga et al. | JP | 8083877 | 3/1996 |
| 2004/0253803 A1 | 12/2004 | Tomono et al. | JP | 8125066 | 5/1996 |
| 2006/0087020 A1 | 4/2006 | Hirano et al. | JP | 964284 | 6/1996 |
| 2006/0157843 A1 | 7/2006 | Hwang | JP | 8222682 | 8/1996 |
| 2006/0231939 A1 | 10/2006 | Kawabata et al. | JP | 8306853 | 11/1996 |
| 2007/0023202 A1 | 2/2007 | Shibata et al. | JP | 98205 | 1/1997 |
| | | | JP | 98206 | 1/1997 |
| FOREIGN PATENT DOCUMENTS | | | JP | 98207 | 1/1997 |
| EP | 0393997 | 10/1990 | JP | 992775 | 4/1997 |
| EP | 0459493 | 12/1991 | JP | 9260568 | 10/1997 |
| EP | 0720225 | 3/1996 | JP | 9293822 | 11/1997 |
| EP | 0720234 | 3/1996 | JP | 10022447 | 1/1998 |
| EP | 0794572 A2 | 10/1997 | JP | 10199934 | 7/1998 |
| EP | 0844665 | 5/1998 | JP | 10256240 | 9/1998 |
| EP | 0936671 | 8/1999 | JP | 11307675 | 11/1999 |
| EP | 0989608 | 3/2000 | JP | 2000150765 | 5/2000 |
| EP | 1032037 | 8/2000 | JP | 200160648 | 3/2001 |
| JP | 55163868 | 12/1980 | JP | 2002519848 | 7/2002 |
| JP | 5745959 | 3/1982 | JP | 200243497 | 8/2002 |
| JP | 58160096 | 8/1983 | KR | 941979 | 1/1994 |
| JP | 59208756 | 11/1984 | KR | 19940010938 | 5/1994 |
| JP | 59227143 | 12/1984 | KR | 19950018924 | 6/1995 |
| JP | 60010756 | 1/1985 | KR | 19950041844 | 11/1995 |
| JP | 60116239 | 8/1985 | KR | 19950044554 | 11/1995 |
| JP | 60195957 | 10/1985 | KR | 19950052621 | 12/1995 |
| JP | 60231349 | 11/1985 | KR | 1996074111 | 12/1996 |
| JP | 6139555 | 2/1986 | KR | 9772358 | 11/1997 |
| JP | 61248541 | 11/1986 | KR | 100220154 | 6/1999 |
| JP | 629639 | 1/1987 | KR | 20000072714 | 12/2000 |
| JP | 6333854 | 2/1988 | KR | 20000086238 | 12/2000 |
| JP | 63067762 | 3/1988 | KR | 20020049944 | 6/2002 |
| JP | 63188964 | 8/1988 | WO | 9956316 | 11/1999 |
| JP | 63205935 | 8/1988 | WO | 9967821 | 12/1999 |
| JP | 63233555 | 9/1988 | | | |
| JP | 63249345 | 10/1988 | | | |
| JP | 63289951 | 11/1988 | | | |
| JP | 63316470 | 12/1988 | | | |
| JP | 64054749 | 3/1989 | | | |
| JP | 1106456 | 4/1989 | | | |
| JP | 1175250 | 7/1989 | | | |
| JP | 1205544 | 8/1989 | | | |
| JP | 1251747 | 10/1989 | | | |
| JP | 2129948 | 5/1990 | | | |
| JP | 369248 | 7/1991 | | | |
| JP | 3177060 | 8/1991 | | | |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

US 8,125,064 B1

INCREASED I/O SEMICONDUCTOR PACKAGE AND METHOD OF MAKING SAME

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The invention relates generally to a semiconductor package and a fabricating method thereof.

2. Description of the Related Art

Generally, a substrate for a printed circuit board (PCB) and a lead frame have been used as an electrical media in a semiconductor package. The substrate for the PCB is fabricated by forming an insulation layer, forming at least one via in the insulation layer, and thereafter filling the via with metal to form a conductive via. Then, fabrication of the substrate is continued by forming a conductive pattern and at least one land on upper and lower surfaces of the insulation layer, respectively.

The substrate for PCB is mainly an insulator such as thermal-setting resin, which has a low thermal conductivity not great enough to dissipate heat generated from a semiconductor die mounted thereon. Further, the process for forming a conductive via, a conductive pattern and a land on the substrate for PCB is accomplished through various steps, so that the productivity is decreased due to complexity of fabrication processes. Thus, fabricating costs for the substrate are increased due to complexity of the process.

Meanwhile, in order to solve the problem, a lead frame package is provided with a frame having a lead serving as input/output terminals. Consequently, the above-described problem of the fabrication of the substrate for PCB is solved by the lead frame package, but the number of input/output leads is limited by forming the input/output leads only in a peripheral area of the semiconductor die.

BRIEF SUMMARY OF THE INVENTION

In accordance with the present invention, there is provided a semiconductor package and a fabrication method thereof. The semiconductor package is provided with a substrate made of metal, thereby improving efficiency of thermal emission from a semiconductor die mounted to the substrate, and simplifying the fabrication process for the substrate which reduces fabricating costs. Further, unlike a conventional land, a rivet electrically insulated with the substrate is inserted into a corresponding hole of the substrate, the upper and lower surfaces of the rivet being removed to form land, thereby simplifying the fabrication process for the substrate which further reduces fabricating costs. The present invention will be more apparent from the following detailed description taken in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and the detailed description to indicate the same elements.

DETAILED DESCRIPTION OF THE INVENTION

Figure 1A:
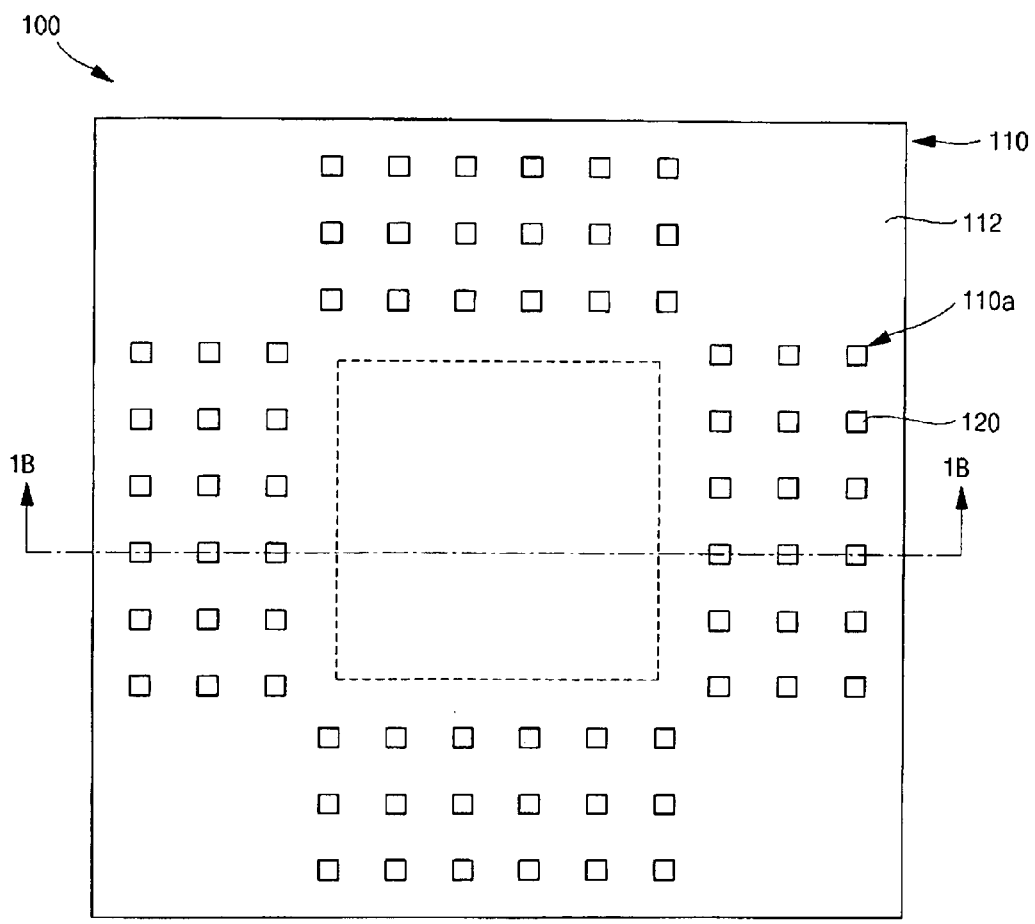
FIG. 1A is a bottom plan view of a semiconductor package according to an exemplary embodiment of the present invention.

Referring now to the drawings wherein the showings are for purposes of illustrating various embodiments of the present invention only, and not for purposes of limiting the same, FIG. 1A illustrates a substrate 110 and a land 120 used for a semiconductor package 100 according to an exemplary embodiment of the present invention.

Figure 1B:
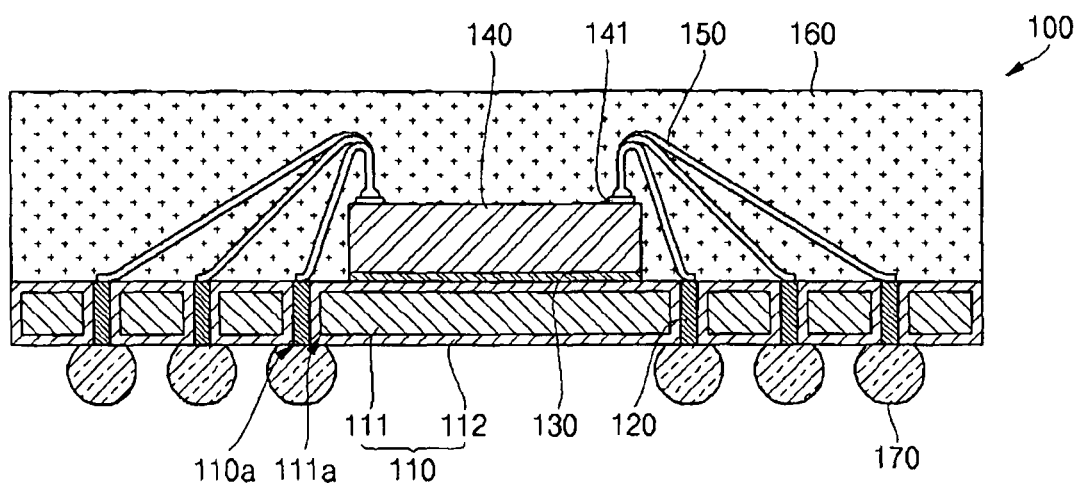
FIG. 1B is a cross-sectional view taken along 1B-1B of FIG. 1A.

Referring to FIGS. 1A and 1B, the semiconductor package 100 may include a substrate 110, a land 120 penetrating the substrate 110, an adhesive 130 formed on an upper portion of the substrate 110, a semiconductor die 140 mounted on an upper portion of the adhesive 130, a conductive wire 150 electrically coupling the land 120 and the semiconductor die 140, an encapsulant 160 encapsulating the semiconductor die 140 and the conductive wire 150, and a solder ball 170 formed on a lower portion of the land 120.

The substrate 110 is preferably formed in a plate shape and is provided with an area for mounting the semiconductor die 140. In addition, the substrate 110 includes a patterned metal layer 111 defining a plurality of holes 111a within the substrate 110, and an insulation layer 112 formed along an outer portion of the patterned metal layer 111.

The patterned metal layer 111 formed in a plate shape is provided with a plurality of holes 111a as indicated above. The layer 111 can be made of a metal alloy including one or more metals selected from metals such as copper, aluminum, nickel and the like. Accordingly, the layer 111 increases thermal conductivity of the substrate 110, and thus heat generated from the semiconductor die 140 disposed on an upper portion of the patterned metal layer 111 as a heatproof plate is easily dissipated outside the semiconductor device 100.

Further, since the substrate 110 using the patterned metal layer 111 is made of metal, warpage due to heat generated from the substrate 110 can be prevented. The thickness of the substrate 110 may be from about 0.2 mm to 1.0 mm for preventing warpage, but not limited thereto.

The insulation layer 112 is formed along an outer surface of the patterned metal layer 111. In other words, the insulation layer 112 is formed along an inner wall of the holes 111a formed within the patterned metal layer 111, in addition to upper and lower surfaces of the layer 111. The insulation layer 112 may be made of insulation resin. The insulation layer 112 may be formed by coating, spraying, vacuum printing, or dipping the patterned metal layer 111 into a resin bath, though the present mention is not limited to any particular method for forming the insulation layer 112. Accordingly, the insulation layer 112 allows the patterned metal layer 111 and the land 120 formed inside the holes 111a of the patterned metal layer 111 to be electrically independent.

Each land 120 is formed by filling one of the plurality of holes 110a collectively defined by the holes 111a as lined with the insulation layer 112 with a prescribed conductive material. Since the insulation layer 112 is already provided inside the holes 111a of the patterned metal layer 111, each land 120 is thus surrounded by the insulation layer 112. Further, each land 120 may be formed in to have a square, circular or triangular cross-sectional shape, though not being limited to these shapes. Each land 120 may be formed by selecting any one of gold, silver, copper, aluminum, solder, or combinations thereof. Further, each land 120 is exposed in the upper and lower surfaces of the substrate 110, and the conductive wire 150 and the solder ball 170 may be connected to respective ones of the exposed portions thereof.

The adhesive 130 is formed on an upper portion of the substrate 110. The adhesive 130 attaches the substrate 110 to the semiconductor die 140. Materials of the adhesive 130 may include an epoxy, an adhesive tape or their equivalent materials, though not being limited thereto. The semiconductor die 140 is attached to the upper portion of the substrate 110 with the adhesive 130. Although the only one semiconductor die 140 is shown, it is contemplated that a plurality of semiconductor dies 140 can be stacked within the semiconductor package 100. Further, the semiconductor die 140 is provided with a plurality of bond pads 141 on an upper portion thereof. Although the bond pads 141 are shown as protruding from the upper portion of the semiconductor die 140, the bond pads 141 may be formed inside the semiconductor die 140.

The conductive wires 150 electrically couple the bond pads 141 of the semiconductor die 140 to respective ones of the lands 120. Each conductive wire 150 is provided by normal wire bonding such that one end of the conductive wire 150 forms a ball bonding area on a bond pad 141 of the semiconductor die 150, and the other end of the conductive wire 150 forms a stitch bonding area on the exposed upper portion of a corresponding land 120. Additionally, although not shown in the drawings, the conductive wire 150 may be provided by standoff stitch bonding (SSB) that forms the ball bonding area on the land 120, and connects the ball bonding area with a stud bump formed on the corresponding bond pad 141 of the semiconductor die 140.

The encapsulant 160 performs encapsulation covering the semiconductor die 140 and the conductive wire 150. The encapsulant 160 protects the semiconductor die 140 and the conductive wire 150 from external shock. The encapsulant 150 may be selected from one of epoxy resin, silicone resin or equivalent materials, but is not limited thereto.

Each solder ball 170 is formed on the exposed lower portion of a corresponding land 120. Further, each solder ball 170 may be electrically coupled with an external circuit. Each solder ball 170 can be made of a metal alloy including one or more metals selected from metals such as tin (Sn), lead (Pb) or silver (Ag) and the like, but is not limited thereto.

As indicated above, in the semiconductor package 100, the substrate 110 including the patterned metal layer 111 made of metal plays a role of a heatproof plate, thereby dissipating heat generated from the semiconductor die 140 to the outside. Additionally, the semiconductor package 100 has reduced susceptibility to warpage attributable to heat generated from the substrate 110. The semiconductor package 100 may have a number of the solder balls 180 commensurate to that of a conventional BGA (Ball Grid Array) package. The substrate 110 can be formed by a relatively simple process for etching a metal layer and an insulation layer so as to save fabricating costs in relation thereto.

Hereinafter, the structure of the semiconductor package 200 according to another exemplary embodiment of the present invention will be explained. Common reference numerals are used throughout the drawings and the detailed description to indicate the same element, and the differences between the above exemplary embodiments will be explained in detail below.

Figure 2A:
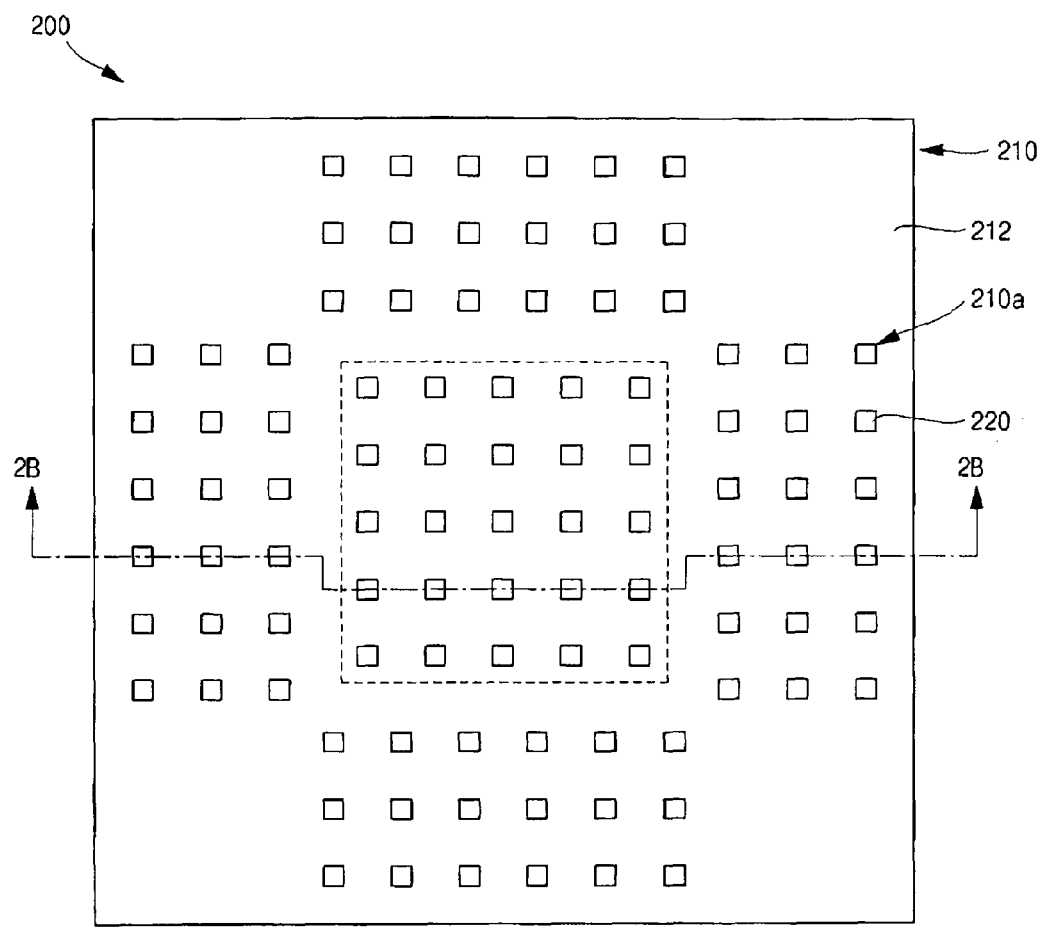
FIG. 2A is a bottom plan view of a semiconductor package according to another exemplary embodiment of the present invention.
Figure 2B:
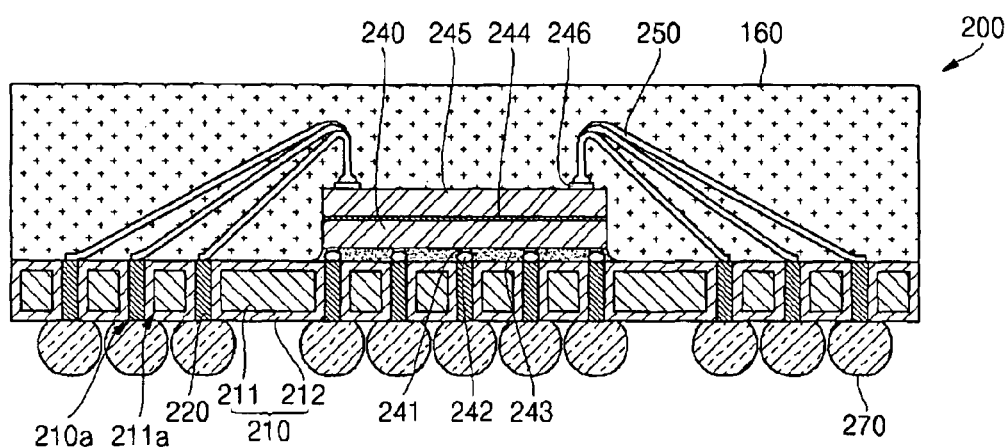
FIG. 2B is a cross-sectional view taken along 2B-2B of FIG. 2A.

Referring to FIGS. 2A and 2B, the semiconductor 200 may include a substrate 210, at least one land 220 formed on the substrate 210, a first semiconductor die 240 mounted to the substrate 210, a conductive bump 242 electrically coupling the first semiconductor die 240 to the land 220, an underfill 243 formed between the substrate 210 and the first semiconductor die 240, a second semiconductor die 245 stacked upon an upper portion of the first semiconductor die 240, at least one conductive wire 250 electrically coupling the second semiconductor die 245 and the land 220, an encapsulant 160 formed on an upper portion of the substrate 210, and at least one solder ball 270 formed on a lower portion of the substrate 210 and electrically coupled to the land 220.

The substrate 210 may include a patterned metal layer 211 defining a plurality of holes 211a, and having an insulation layer 212 formed along an outer portion of the patterned metal layer 211. The insulation layer 212 is formed inside the holes 211a, in addition to upper and lower surfaces of the patterned metal layer 211. However, the insulation layer 212 is formed along an inner wall of each of the holes 211a instead of completely filling the holes 211a of the patterned metal layer 211. As a result, the holes 210a collectively defined by the holes 211a as lined with the insulation layer 212 are of sufficient size or diameter to form respective ones of the lands 220.

Each land 220 is formed completely by filling the inside each hole 210a of the substrate 210 with a conductive metal material. The lands 220 are also formed in areas of the substrate 210 so as to be operative to electrically connect the first semiconductor die 240 directly to the solder balls 270 through the use of the lands 220. The structural and functional attributes of the lands 220 is the same as the lands 120 in the above-described exemplary embodiment.

The first semiconductor die 240 is mounted in a flip-chip arrangement on the upper portion of the substrate 210. The first semiconductor die 240 is provided with bond pads 241 on one surface thereof, the bond pads 241 being arranged to be electrically coupled to respective ones of the lands 220. In this regard, the conductive bumps 242 electrically couple the bond pads 241 of the first semiconductor die 240 to respective ones of the lands 220. The conductive bumps 242 connect the bond pads 241 of the first semiconductor die 240 to the lands 220, thereby reducing the length in comparison with connection by wire and then reducing noise of inputted/outputted electric signals.

The underfill 243 is formed between the first semiconductor die 240 and the substrate 210. The underfill 243 is formed using epoxy, generally. The underfill 243 reduces stress applied to the first semiconductor die 240 due to difference of the coefficient of thermal expansion between the first semiconductor die 240 and the substrate 210.

The second semiconductor die 245 is adhered to the upper portion of the first semiconductor die 240 using an adhesive 244. The second semiconductor die 245 is the same as the semiconductor die 140 of the semiconductor package 100 as explained above, except that the adhesive 244 is formed on the upper portion of the first semiconductor die 241.

The conductive wires 250 shown in FIG. 2B electrically couple the bond pads 246 of the second semiconductor die 245 to the lands 220. The conductive wires 250 are the same as the conductive wires 150 of the semiconductor package 100 as explained above, except that the conductive wires 250 are electrically connected to the second semiconductor die 245 in the semiconductor package 200.

The solder balls 270 are formed on a lower surface of the substrate 210 and electrically coupled with respective ones of the lands 220. The solder balls 270 are also formed so as to input and output an electrical signal from the semiconductor package 200. The solder balls 270 are the same as the solder balls 170 of the semiconductor package 100, as explained above.

As described above, the semiconductor package 200 is provided with the substrate 210 used as a heatproof plate. As a result, a thermal dissipation rate of the semiconductor die 240 is increased, with warpage due to heat generated from the substrate 210 being prevented and fabrication costs for the substrate 210 being reduced. Additionally, the substrate 210 may be fabricated with a relatively simple process, and provide the same number of the solder balls 270 as a conventional BGA package. The substrate 210 corresponding to a filp-chip shaped semiconductor die can reduce noise of input/output signals.

Hereinafter, the structure of a semiconductor package 300 according to still another exemplary embodiment of the present invention will be explained in detail.

Figure 3A:
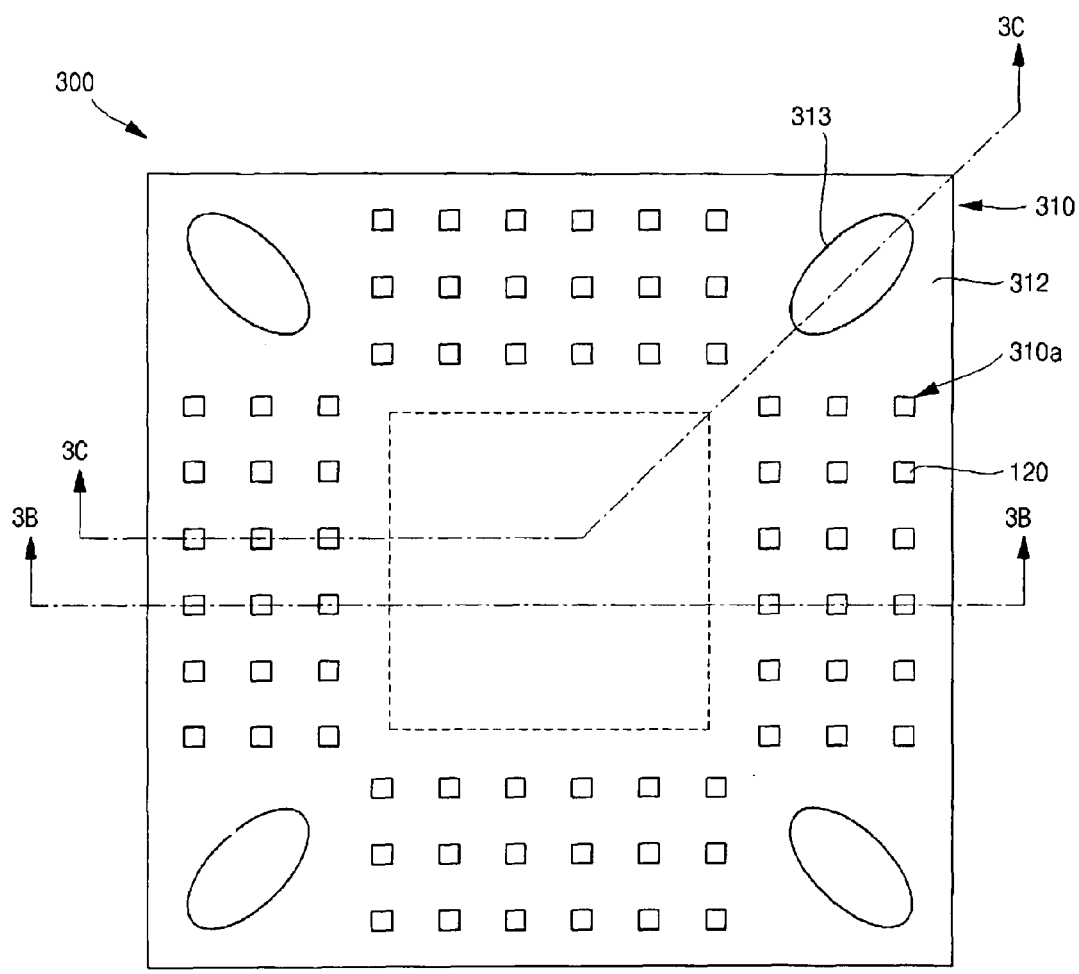
FIG. 3A is a bottom plan view of a semiconductor package according to another exemplary embodiment of the present invention.
Figure 3B:
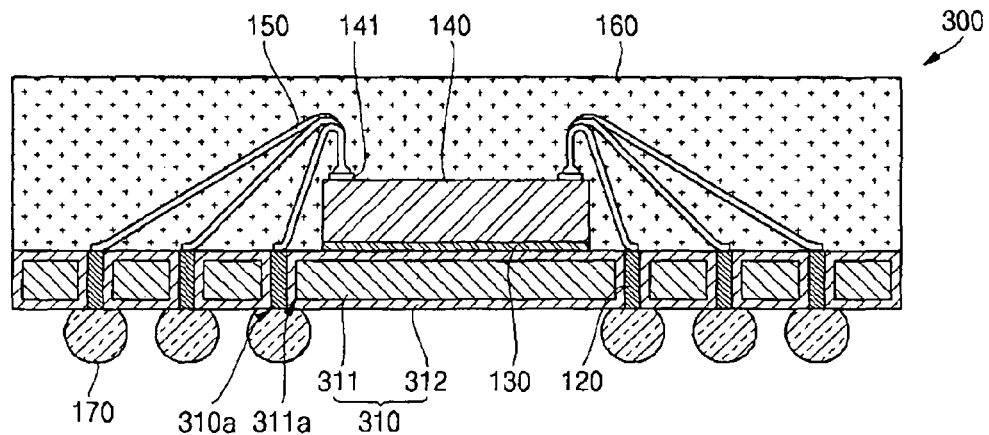
FIG. 3B is a cross-sectional view taken along 3B-3B of FIG. 3A.
Figure 3C:
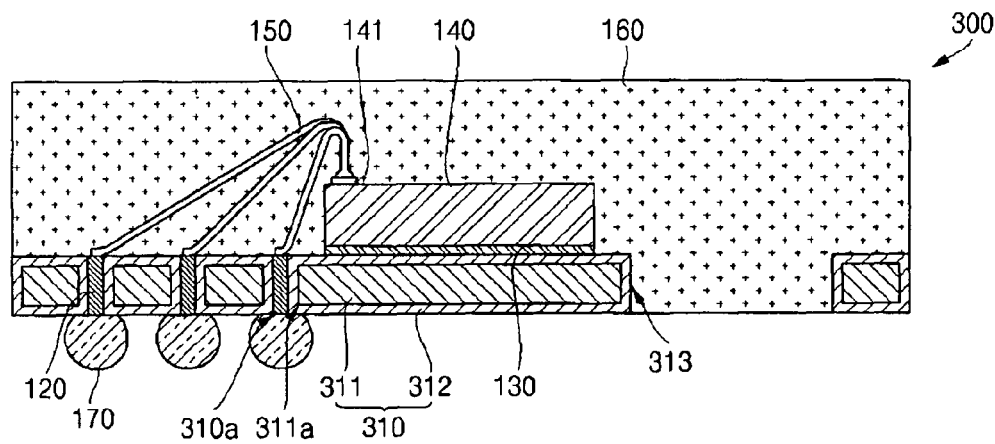
FIG. 3C is a cross-sectional view taken along 3C-3C of FIG. 3A.

Referring to FIGS. 3A and 3B, the semiconductor package 300 according to still another exemplary embodiment of the present invention may include a substrate 310, at least one land 120, an adhesive 130, a semiconductor die 140, a conductive wire 150, an encapsulant 160 and at least one solder ball 170 electrically connected to the land 120.

The substrate 310 may include a patterned metal layer 311 defining a plurality of holes 311a, and an insulation layer 312 formed on the patterned metal layer 311. Further, the substrate 310 of the semiconductor package 300 is provided with at least one hole 310a collectively defined by the hole 311a and the insulation layer 312 for accommodating a land 120 in the same manner described above in relation to the semiconductor package 100. The substrate 310 may further define one or more penetration areas or openings 313 in prescribed portions thereof. Each penetration opening 313 extends through the substrate 310, and is defined by an opening in patterned metal layer 311 which is covered or lined with the insulation layer 312, similar to the manner in which each of the holes 310a are formed. The penetration openings 313 each preferably have a generally elliptical as shown, though other configurations such as a circular, triangular, square or star shape are contemplated to be within the spirit and scope of the present invention. Each penetration opening 313 is ultimately filled with the encapsulant 160. Accordingly, the penetration openings 313 increase a surface area in which the encapsulant 160 is engaged with the substrate 310, thereby increasing the adhesion force between the substrate 310 and the encapsulant 160.

As described above, the semiconductor 300 of the present invention is provided with the substrate 310 serving as a heatproof plate, so as to easily dissipate heat generated from the semiconductor die 140, the substrate configuration also saving fabrication costs, preventing warpage due to heat generated from the semiconductor die 140, and defining the same number of solder balls 170 as a conventional BGA package. In addition, the filling of the encapsulant 160 into the penetration opening(s) 313 increases the adhesion force between the substrate 310 and the encapsulant 160.

Hereinafter, a semiconductor package 400 according to still another exemplary embodiment of the present invention will be explained in detail.

Figure 4A:
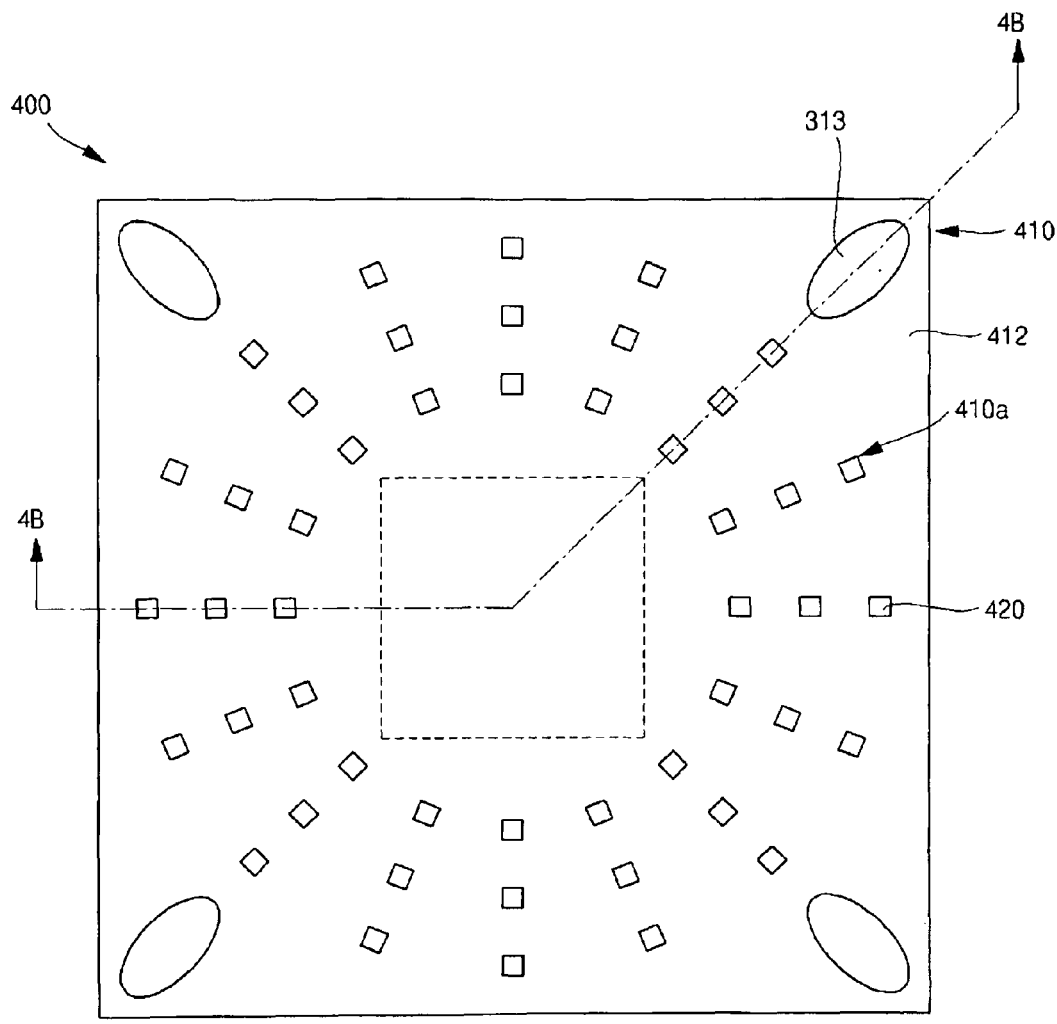
FIG. 4A is a bottom plan view of a semiconductor package according to another exemplary embodiment of the present invention.
Figure 4B:
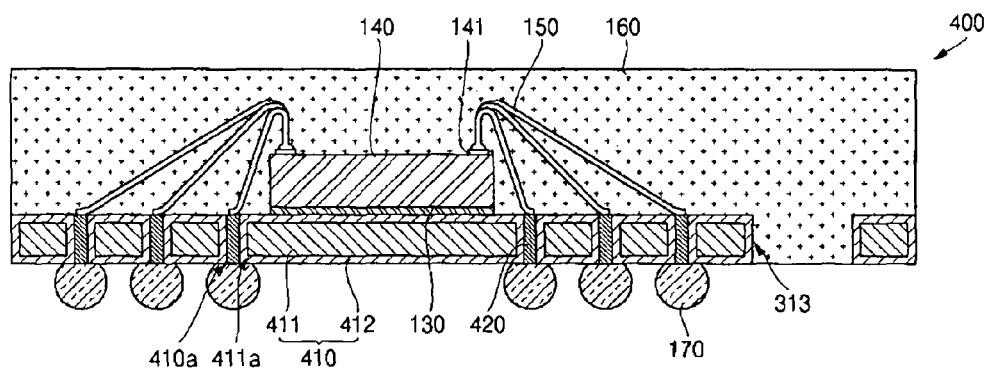
FIG. 4B is a cross-sectional view taken along 4B-4B of FIG. 4A.

Referring to FIGS. 4A and 4B, the semiconductor package 400 according to still another exemplary embodiment of the present invention may include the substrate 410, a plurality of lands 420 penetrating and thus extending through the substrate 410, an adhesive 130, a semiconductor die 140, a conductive wire 450 electrically coupling the lands 420 to the semiconductor die 140, an encapsulant 160 and solder balls 170 electrically coupled to respective ones of the lands 420.

The substrate 410 is formed in a plate shape and may include a patterned metal layer 411 defining a plurality of holes 411a, an insulation layer 412 formed on at least a portion of the patterned metal layer 411 and at least one penetration area or opening 313 penetrating or extending through the substrate 410. The holes 410a of the substrate 410 which are each collectively defined by a hole 411a as internally coated by the insulation layer 412 may be arranged in a radial pattern about a center of the substrate 410 as shown in FIG. 4A. Further, although not shown in the drawings, the holes 410a may be arranged in a crossing pattern on the substrate 410.

Each land 420 is formed by filling a respective one of the holes 410a of the substrate 410 with a conductive metal material as described above in relation to other embodiments. Accordingly, the lands 420 are also arranged in a generally radial pattern or a crossing pattern about a center of the substrate 410. The lands 420 are electrically coupled with respective ones of the conductive wires 450, which are in turn electrically coupled to respective ones of the bond pads 141 of the semiconductor die 140. The spacing and arrangement of the lands 420 is such that the sweeping of the conductive wires 450 may be prevented during the encapsulation process to form the encapsulant 160, so as to prevent an electrical short or cross from being mutually generated.

As indicated above, the conductive wires 450 electrically couple the lands 420 to the bond pads 141 of the semiconductor die 140. Further, the lands 420 are arranged in a radial pattern or a crossing pattern so that the conductive wires 450 have a maximum spacing or separation distance from each other. Accordingly, the conductive wires 450 are less susceptible to sweeping in the encapsulation process, thereby preventing an electrical short or cross from being mutually generated. As also indicated above, the semiconductor package 400 is provided with the substrate 410 which functions as a heatproof plate so as to dissipate heat generated from the semiconductor die 140 easily, and is less susceptible to warpage due to heat generated from the semiconductor die 140.

Hereinafter, the structure of a semiconductor package 500 according to still another exemplary embodiment of the present invention will be explained in detail.

Figure 5:
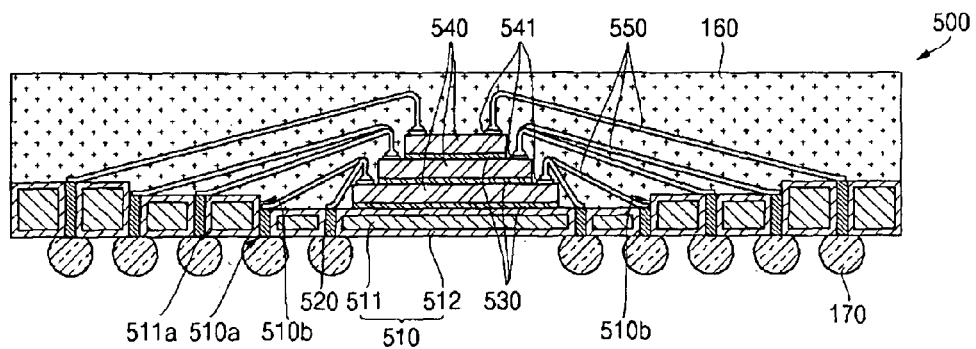
FIG. 5 is a cross-sectional view of a semiconductor package according to still another exemplary embodiment of the present invention.

Referring to FIG. 5, the semiconductor package 500 may include a substrate 510, at least one land 520 penetrating or extending through the substrate 510, an adhesive 530 formed on the substrate 510, at least one semiconductor die 540 attached to the substrate 510 with the adhesive 530, at least one conductive wire 550 electrically coupling the semiconductor die 540 to the land 520, an encapsulant 160 and a solder ball 170 electrically connected to the land 520.

The substrate 510 includes a patterned metal layer 511 defining holes 511a and an insulation layer 512 covering at least a portion of the patterned metal layer 511. The substrate also includes holes 510a which are each collectively defined by one of the holes 511a as internally coated with the insulation layer 512, each of the holes 510a accommodating a respective one of the lands 520.

Further, the substrate 510 defines at least one step 510b, which effectively creates a an inner portion of a first thickness, a middle portion which circumvents the inner portion and is of a second thickness exceeding the first thickness, and a peripheral outer portion which circumvents the middle portion and is of a third thickness exceeding the second thickness. The semiconductor die 540 is mounted to the center of the inner portion of the substrate 510.

A plurality of lands 520 is disposed in the substrate 510 within respective ones of the holes 510a thereof. As seen in FIG. 5, the holes 510a are of differing heights, depending on which of the inner, middle and outer portions of the substrate in which they are positioned. As a result, certain sets or groups of the lands 520 are also of differing heights or thicknesses, depending on which of the inner, middle and outer portions in which they are located. In other words, each land 520 is formed at the same height or thickness of that portion of the substrate 510 in which it is located. The lands 520 are electrically connected to the semiconductor die 540 by the conductive wires 550. Accordingly, the lands 520 are elevated higher toward the outer portion of the substrate 510, thus mitigating against the sweeping of the conductive wires 550 in the encapsulation process to prevent the conductive wires 550 from crossing or shorting.

At least one semiconductor die 540 may be mounted to the central area of the inner portion of the substrate 510. The semiconductor die 540 is provided with bond pads 541 in an upper portion of the semiconductor die 540, and the semiconductor die 540 may be stacked using a portion that the bond pads 541 are not formed upon. Although three semiconductor dies 540 are stacked are shown in FIG. 5, the present invention is not limited to any particular number or arrangement of semiconductor dies 540.

The conductive wires 550 electrically couple the bond pads 541 of the semiconductor dies 540 to respective ones of the lands 520. Further, the height of the lands 520 is formed to be higher toward the outer portion of the substrate 510 as indicated above, and thus the conductive wires 550 extending to the bond pads 541 may be separated from each other by a corresponding distance. Accordingly, the sweeping of the conductive wires 550 may be mitigated or prevented in the encapsulation process used to form the package body 160, thereby preventing the conductive wires 550 from crossing or shorting. As also described above, the semiconductor package 500 is provided with the substrate 410 which serves as a heatproof plate so as to easily emit heat generated from the semiconductor die(s) 540, and is less susceptible to warpage due to heat generated from the semiconductor die(s) 540.

Hereinafter, the structure of a semiconductor package 600 according to still another exemplary embodiment of the present invention will be explained in detail.

Figure 6:
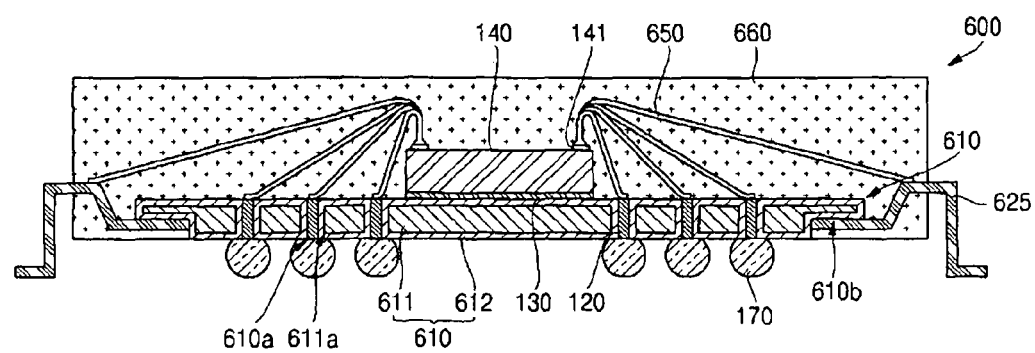
FIG. 6 is a cross-sectional view of a semiconductor package according to still another exemplary embodiment of the present invention.

Referring to FIG. 6, the semiconductor package 600 may include a substrate 610, at least one land 120, at least one lead 625 connected with a side portion of the substrate 610, an adhesive 130, at least one semiconductor die 140, at least one conductive wire 650, an encapsulant 660 and at least one solder ball 170 electrically connected to the land 120.

The substrate 610 is generally formed in a plate shape. The substrate 610 includes a patterned metal layer 611 which defines a plurality of holes 611a and is at least partially covered by an insulation layer 612. The substrate 610 also includes a plurality of holes 610a which are each collectively defined by a hole 611a as internally covered or coated with the insulation layer 612. Each hole 610a accommodates a respective one of the lands 620. Further, a peripheral portion of the substrate 610 is etched on a lower portion or surface of the substrate 610, thus forming a peripheral stepped portion 610b which is of a reduced thickness in comparison to the remainder of the substrate 610.

Each lead 625 is connected with the stepped portion 610b of the substrate 610 by a tape, an adhesive or the like, and is outwardly exposed through a side portion or surface of the encapsulant 660. The stepped portion 610b of the substrate 610 is covered with the insulation layer 612 and maintained in an insulated state, and thus the leads 625 can be electrically independent of the substrate 610. Further, the leads 625 can be electrically coupled to the semiconductor die 140 by the conductive wires 650.

The conductive wires 650 electrically couple the semiconductor die 140 to respective ones of the lands 120. Further, as described above, the conductive wires 650 may be used to electrically couple the semiconductor die 140 to the lead 625.

The encapsulant 660 covers the stepped portion 610b of the substrate 610, inner portions of the leads 625, the semiconductor die 140 and the conductive wires 650. Accordingly, the encapsulant 660 promotes bonding or adhesion between the stepped portion 610b of the substrate 610 and the leads 625. Further, as indicated above, the leads 625 protrude from a side surface of the encapsulant 660.

As described above, the semiconductor package 600 is provided with the lead(s) 625 so as to increase the number of terminals to be connected with an external circuit. Further, the semiconductor package 600 is provided with the substrate 610 made of metal, which is used as a heatproof plate, thus allowing the heat generated from the semiconductor die 140 to be dissipated easily, while being less susceptible to warpage attributable to the heat.

Hereinafter, the structure of a semiconductor package 700 according to still another exemplary embodiment of the present invention will be explained in detail.

Figure 7:
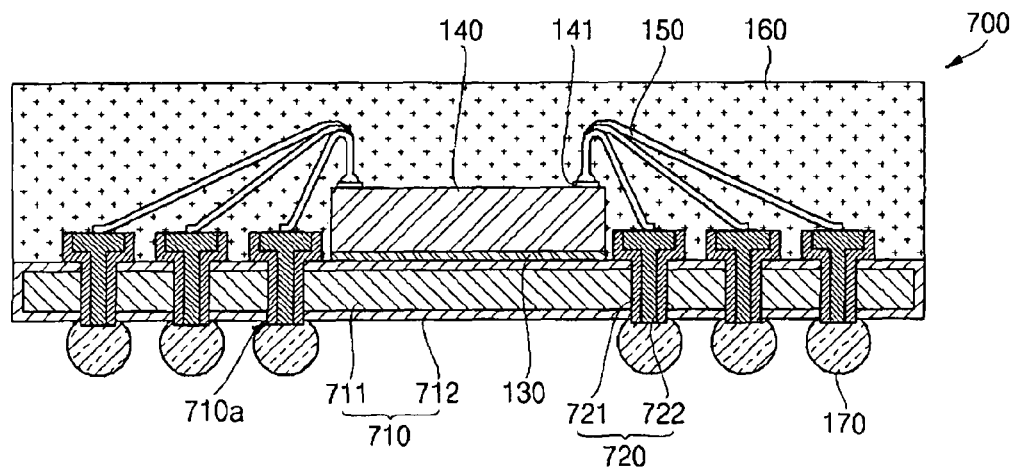
FIG. 7 is a cross-sectional view of a semiconductor package according to still another exemplary embodiment of the present invention.

Referring to FIG. 7, the semiconductor package 700 may include a substrate 710, at least one rivet 720 penetrating or extending through the substrate 710, an adhesive 130, at least one semiconductor die 140, at least one conductive wire 150, an encapsulant 160 and at least one solder ball 170 electrically connected to the rivet 720.

The substrate 710 is formed in a plate shape and is provided with a plurality of holes 710a. Further, the substrate 710 may include a patterned metal layer 711 which defines a plurality of holes 711a and is at least partially covered by an insulation layer 712. Each of the holes 710a is collectively defined by a hole 711a and a small portion of the insulation layer 712.

Each rivet 720 is inserted into a respective one of the holes 710a of the substrate 710. An upper portion of each rivet 720 has a larger diameter rather than that of the hole 710a of the substrate 710, and thus the rivet 720 is fixed to the substrate 710 to prevent the rivet 720 from slipping through to a lower portion of the substrate 710. Each rivet 720 may include an outer insulation film 721 which directly contacts the substrate 710 and is open in both directions perpendicular to the substrate 710, and an internal land metal layer 722 which is formed by filling the interior of the insulation film 721 with a conductive metal material. The insulation film 721 insulates the substrate 710 from the land metal layer 722 of the rivet 720.

The land metal layer 722 has one end which is exposed to an upper portion of the substrate 710 and an opposed end which is exposed to a lower portion of the substrate 710. The land metal layer 722 is provided with an upper portion having a diameter larger than that of the hole 710a of the substrate 710 so as to be fixed to the hole 710a of the substrate 710. The land metal layer 722 penetrates or extends through the substrate 710 so as to input and output electrical signals through the land metal layer 722.

As described above, the semiconductor package 700 is provided with the substrate 710 used as a heatproof plate, thereby easily dissipating heat generated from the semiconductor die 140 and being less susceptible to due to such heat. Further, the semiconductor package 700 is provided with the lands 720 within respective ones of the holes 710a of the substrate 710, thereby forming a conventional land, a conductive via and a conductive pattern structure in one process through a single structural element. Accordingly, the fabrication costs for the semiconductor package 700 can be saved through the resultant simplification of the process for forming lands on substrates.

Hereinafter, the structure of a semiconductor package 800 according to still another exemplary embodiment of the present invention will be explained in detail.

Figure 8:
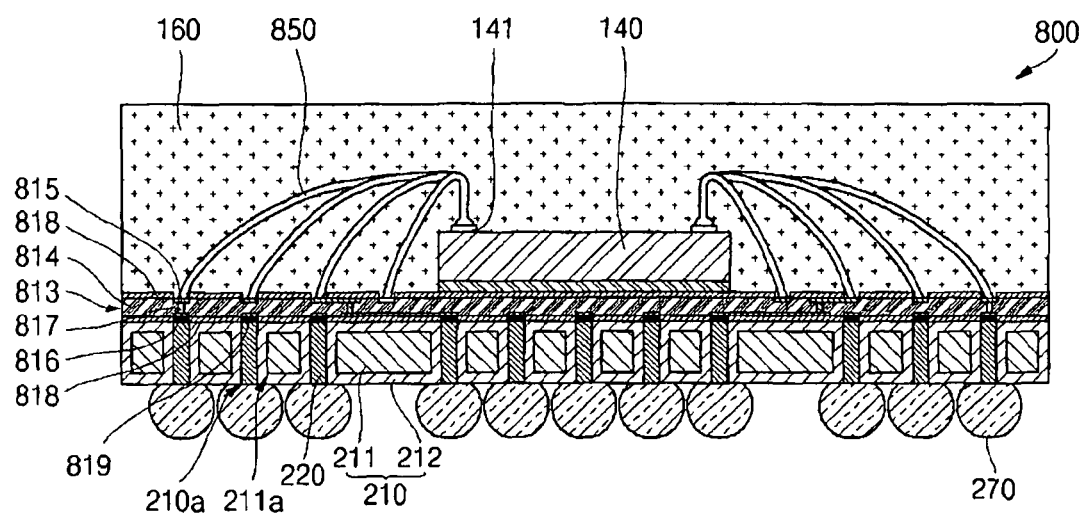
FIG. 8 is a cross-sectional view of a semiconductor package according to still another exemplary embodiment of the present invention.

Referring to FIG. 8, the semiconductor package 800 may include a substrate 210, at least one land 220, a rerouting film 813 formed on an upper portion of the substrate 210, an adhesive 130 formed on an upper portion of the rerouting film 813, a semiconductor die 140, at least one conductive wire 150, an encapsulant 160 and at least one solder ball 270 electrically connected to the land 220.

The rerouting film 813 is formed on an upper portion of the substrate 210. The rerouting film 813 comprises an insulation film 814 extending in parallel to the substrate 210. The rerouting film 813 includes a first pattern 815 formed in an upper side of the insulation film 814, a second pattern 816 formed on a lower side of the insulation film 814 and conductive vias 817 connecting the first and second patterns 815 and 816 to each other in a prescribed pattern or arrangement. Each conductive via 817 is formed in a vertical direction to connect the first and second patterns 815 and 816. Each conductive via 817 may be hollow, and formed with metal along an inner wall of the rerouting film 813. Further, each conductive via 817 may be solid and formed by filling a complimentary opening in the rerouting film 813 with a conductive metal material. Further, the upper and lower portions of the rerouting film 813 may be formed with a separate polyamide layer 818 partially insulating the first and second patterns 815 and 816.

The first pattern 815 is electrically coupled to the lands 220 and hence the solder balls 270 by the vias 817 and the second pattern 816. The second pattern 816 may be interfaced to the lands 220 through the use of electrical coupling members 819. The configuration of the second pattern 816 and vias 817 allows for the electrical of the first pattern 815 to those lands 220 positioned in the substrate 810 beneath the semiconductor die 140. The first and second patterns 815, 816 are each electrically insulated from the semiconductor die 140. However, as indicated above, the second pattern 816 is electrically coupled with the first pattern 815 by the conductive vias 817.

As indicated above, the rerouting film 813 allows certain ones of the lands 220 to be formed beneath the semiconductor die 140. The conductive wires 850 electrically couple the bond pads 141 of the semiconductor die 140 to the first pattern 815 of the rerouting film 813. Accordingly, the conductive wires 850 electrically couple the semiconductor die 140 to the lands 220, and hence the solder balls 270, via the rerouting film 813. The rerouting film 813 effectively routes the signals from certain ones of the conductive wires 850 to those lands 220 which are located beneath the semiconductor die 140.

As described above, the semiconductor package 800 is provided with the substrate 210 which functions as a heat-proof plate, so that the heat generated from the semiconductor die 140 is easily dissipated to the outside, with the substrate 210 also being less susceptible to warpage due to such heat. Further, the substrate 210 can be fabricated by a relatively simple process for etching a metal layer and forming an insulation layer, thus saving fabrication costs. Further, the semiconductor package 800 can be provided with a lot of input/output terminals regardless of a position of the semiconductor die 140 due to the inclusion of the rerouting film 813.

Hereinafter, a fabricating method of the semiconductor package 100 according to an exemplary embodiment of the present invention will be explained in detail.

Figure 9:
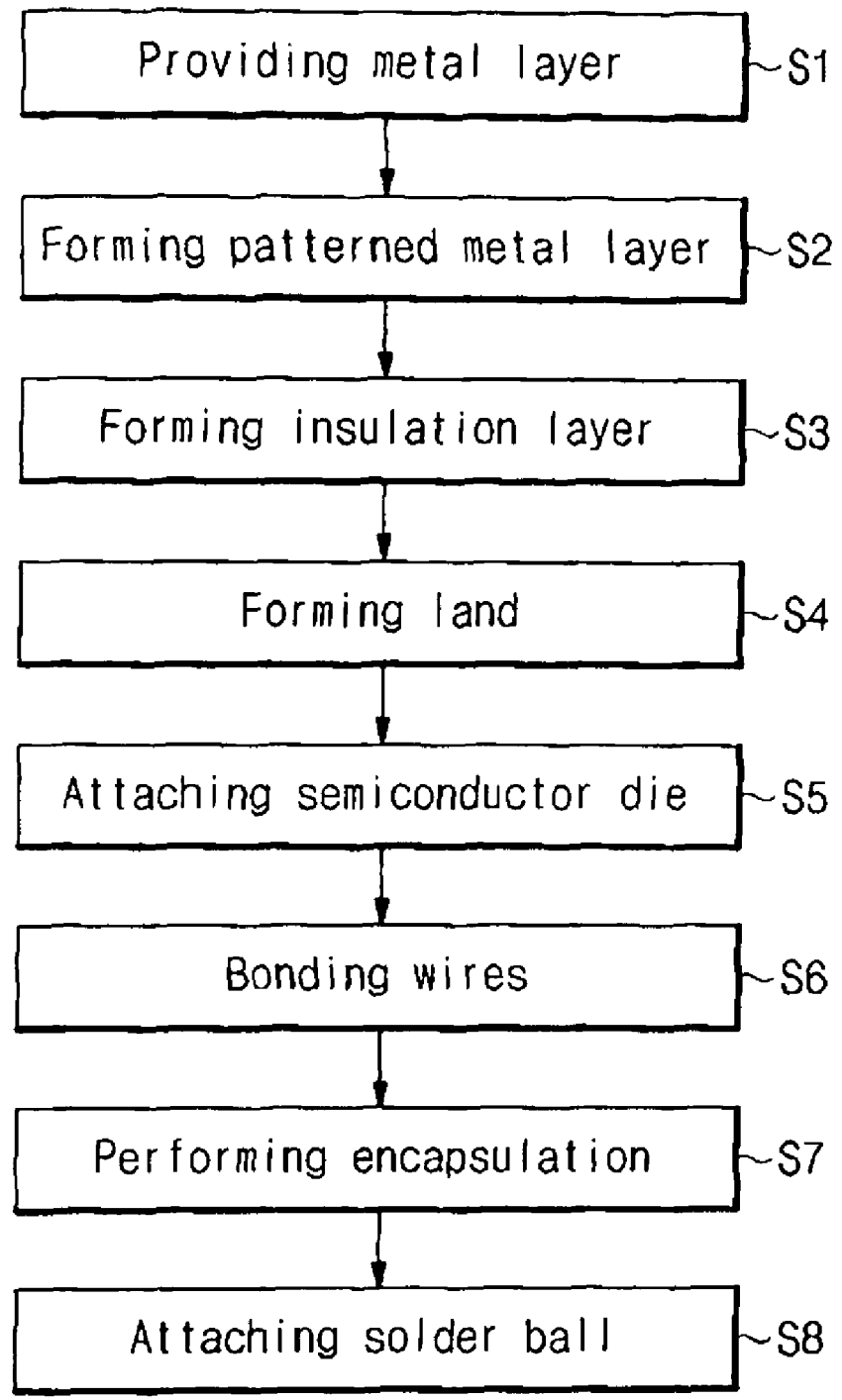
FIG. 9 is a flow chart explaining an exemplary fabrication method for the semiconductor package shown in FIGS. 1A and 1B.

Referring to FIG. 9, the fabrication method for the semiconductor package 100 according to an exemplary embodiment of the present invention includes steps of providing a metal layer (S1), forming a patterned metal layer (S2), forming an insulation layer (S3), forming a land (S4), attaching a semiconductor die (S5), bonding a wire (S6), performing encapsulation (S7) and attaching a solder ball (S8). The steps of FIG. 9 will be explained with reference to FIGS. 10A to 10H below.

Figure 10A:
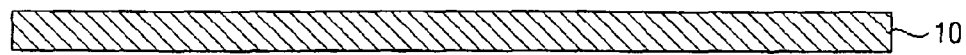
FIGS. 10A through 10H are cross-sectional views illustrating an exemplary sequence of steps which may be used to facilitate the fabrication of the semiconductor package shown in FIGS. 1A and 1B.

Referring to FIGS. 9 and 10A, a metal layer 10 formed in a plate shape is provided (S1). The metal layer 10 is made of a metal material having high thermal conductivity to easily emit heat generated from a semiconductor die to the outside. The metal layer 10 can be made of copper, aluminum, nickel and their alloys.

Figure 10B:
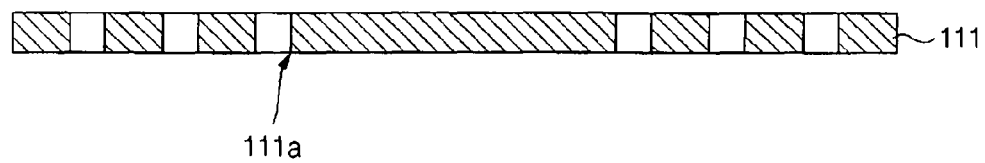

Referring to FIGS. 9 and 10B, holes 111a are formed on the metal layer 10 and then a patterned metal layer 111 is formed (S2). A method for forming the holes 111a in the metal layer 10 may be accomplished by etching. Further, a mask for etching may be formed by attaching a tape or coating a photo-resist in an area except for the area to be formed with the holes 111a in the metal layer 10. In addition, a series of processes are performed to remove the tape or the photo-resist after etching. Further, the method for forming the holes 111a in the metal layer 10 may be accomplished by laser drilling.

Figure 10C:
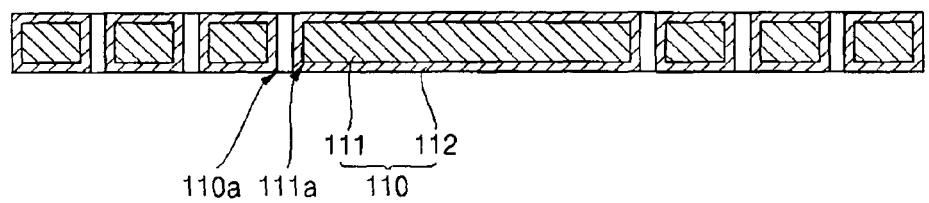

Referring to FIGS. 9 and 10C, an insulation layer 112 is then formed on the patterned metal layer 111, the patterned metal layer 111a and the insulation layer 112 collectively forming a substrate 110 (S3). In order to form the insulation layer 112 on the patterned metal layer 111, an insulation material may be coated on upper and lower surfaces of the pattern metal layer 111. In this process, the insulation material is filled inside and thus coats the interior surfaces of the holes 111a. Further, a vacuum suction process may additionally be performed to form the holes 111a filled with the insulation material. As described above, the insulation layer 112 may be formed on the upper and lower surfaces of the patterned metal layer 111 and along an inner wall of the holes 111a. Holes 110a are defined by the coating of the internal walls of the holes 111a with the insulation layer 112.

Figure 10D:
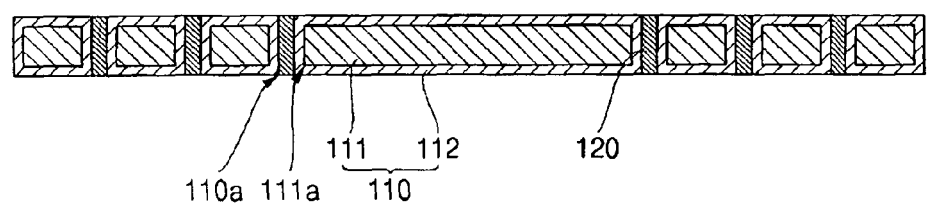

Referring to FIGS. 9 and 10D, the lands 120 are formed in respective ones of the holes 110a (S4). The lands 120 is formed by filling the holes 110a of the substrate 110 with a suitable conductive metal material. Each land 120 may be formed by electroplating after spreading a conductivity plate on a bottom of the substrate 110 and using the conductivity plate as a seed. Of course, after forming each land 120, the conductivity plate is removed. Further, in case that each land is formed of 120 solder, the lands 120 may be formed by filling the holes 110a using solder screen printing.

Figure 10E:
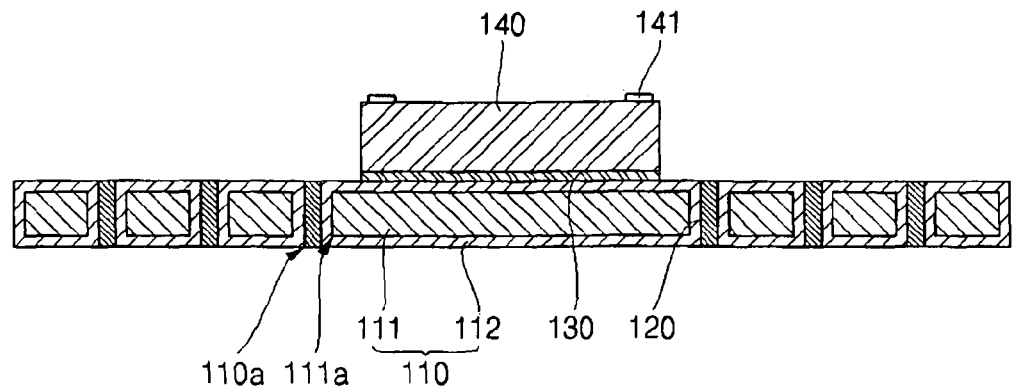

Referring to FIGS. 9 and 10E, the semiconductor die 140 is attached to an upper portion of the substrate 110 (S5). The semiconductor die 140 is attached to the substrate 110 by an adhesive 130 applied to the lower surface thereof.

Figure 10F:
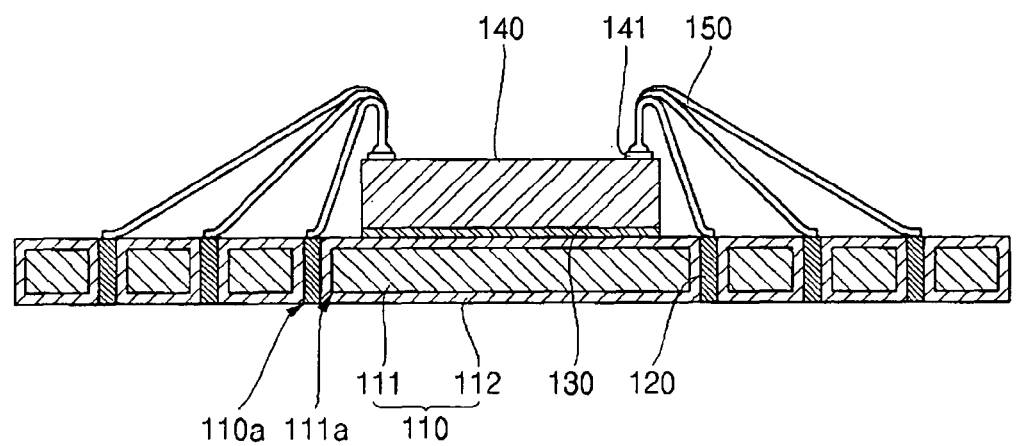

Referring to FIGS. 9 and 10F, the bond pads 141 of the semiconductor die 140 are then electrically coupled to respective ones of the lands 120 using the conductive wires 150 (S6). The conductive wires 150 may each be formed by normal wire bonding that forms a ball bonding area on a respective one of the bond pads 141 of the semiconductor die 140 using one end of the conductive wire 150, and forms a stitch bonding area on a respective one of the lands 120 using the other end of the conductive wire 150. Additionally, although not shown in the drawings, the ball bonding area may formed on the land 120, a stud bump may formed on the bond pad 141 of the semiconductor die 140, and the conductive wire 150 may be formed using a standoff stitch bonding which connects the ball bonding area with the stud bump.

Figure 10G:
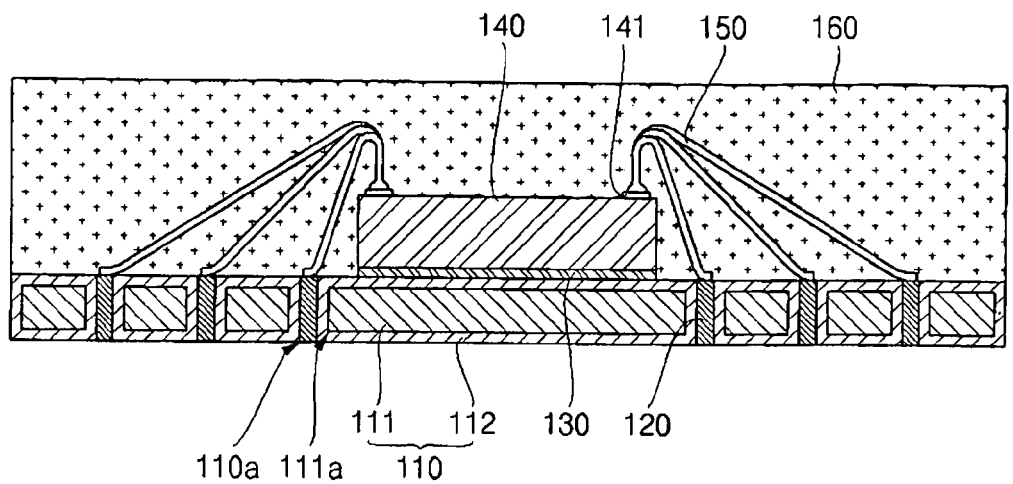

Referring to FIGS. 9 and 10G, the encapsulant 160 is then formed on the upper portion of the substrate 110 (S7). The encapsulant 160 encapsulates the semiconductor die 140 and the conductive wires 150. The encapsulant 160 may be one selected from epoxy resin, silicone resin or equivalent materials.

Figure 10H:
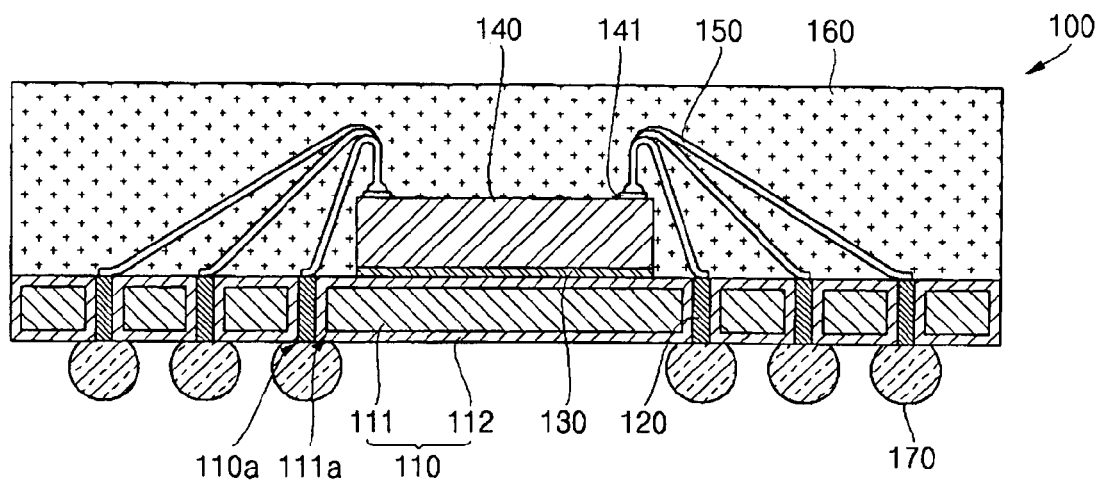

Referring to FIGS. 9 and 10H, the solder balls 170 are then formed on the lower portion of the substrate 110 (S8). The solder balls 170 are electrically connected to respective ones of the lands 120. The solder balls 170 may each be made of a metal alloy including one or more metals selected from the group consisting of tin (Sn), lead (Pb), silver (Ag) or the like.

As described above, the semiconductor package 100 is provided with the substrate 110 which functions as a heat-proof plate, so as to improve efficiency for emitting heat generated from the semiconductor die 140 to the outside, the substrate also being less susceptible to warpage due to such heat and defining the same number of the solder balls 170 as in a conventional BGA semiconductor package. Further, the semiconductor package 100 may be produced through a simplified manufacturing process, thus reducing fabrication costs.

Hereinafter, a fabricating method of the semiconductor package 700 according to still another exemplary embodiment of the present invention will be explained in detail.

Figure 11:
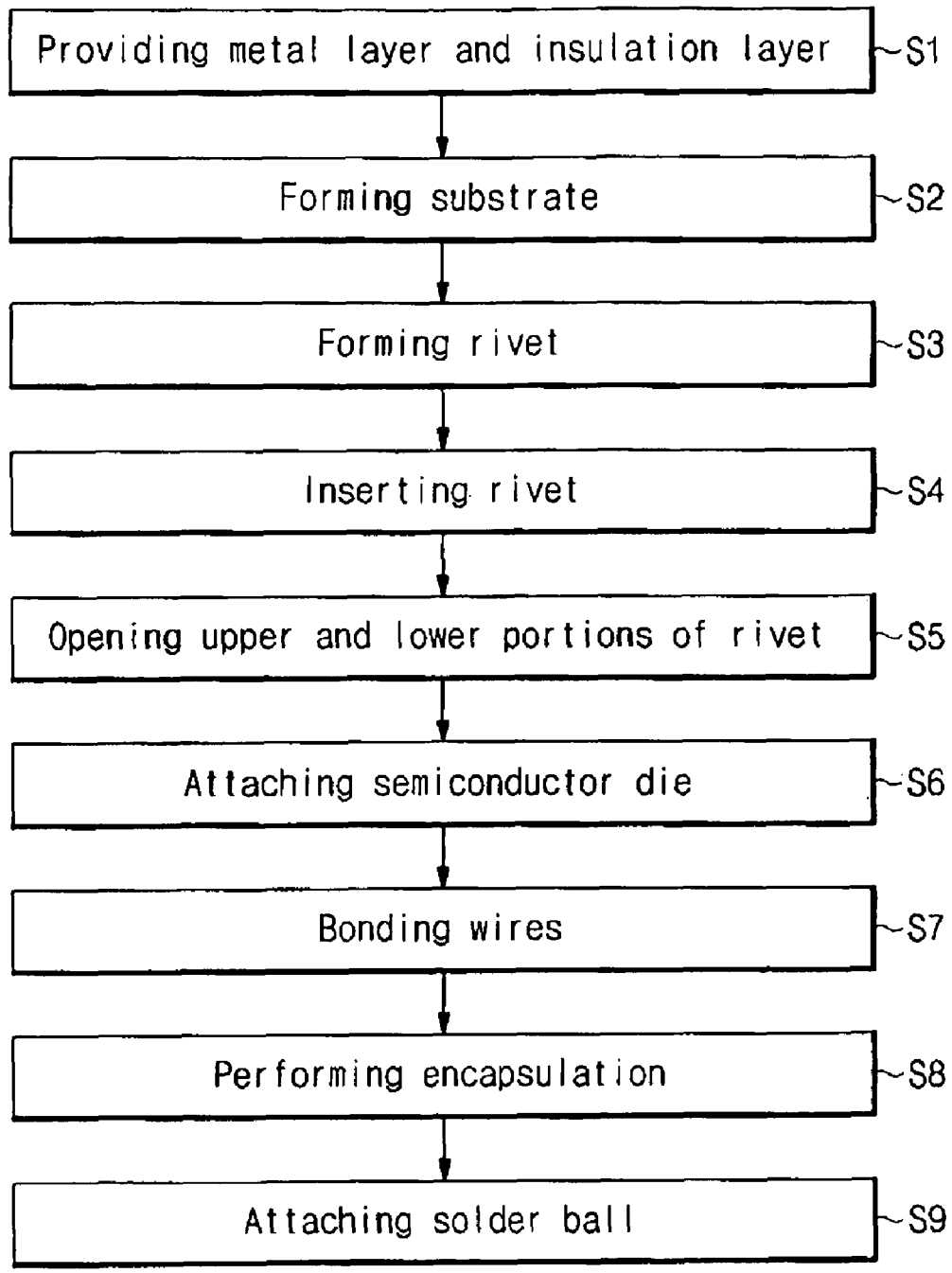
FIG. 11 is a flow chart explaining an exemplary fabrication method for the semiconductor package shown in FIG. 7.

Referring to FIG. 11, the fabrication method for the semiconductor package 700 may include the steps of providing a metal layer and an insulation layer (S1), forming a substrate (S2), forming a rivet (S3), inserting the rivet (S4), opening upper and lower portions of the rivet (S5), attaching a semiconductor die (S6), bonding wires (S7), performing encapsulation (S8) and attaching a solder ball (S9). The steps of FIG. 11 will be explained with reference to FIGS. 12A to 12I below.

Figure 12A:
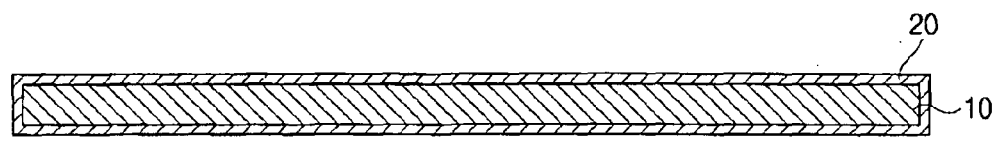
FIGS. 12A through 12I are cross-sectional views illustrating an exemplary sequence of steps which may be used to facilitate the fabrication of the semiconductor package shown in FIG. 7.

Referring to FIGS. 11 and 12A, the metal layer 10 and the insulation layer 20 surrounding or covering an outer portion of the metal layer 10 are provided (S1).

Figure 12B:
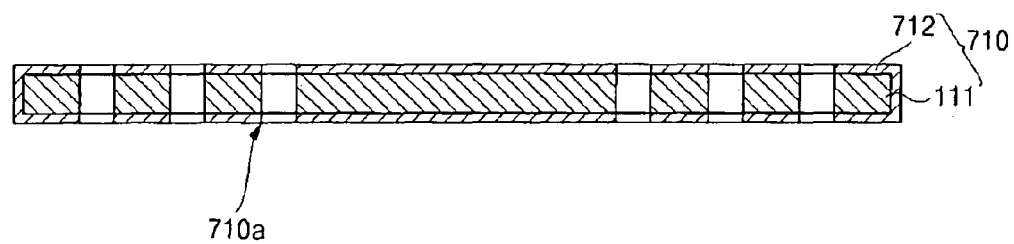

Referring to FIGS. 11 and 12B, the substrate 710 having holes 710a is formed by etching the metal layer 10 and the insulation layer 20 (S2). The substrate 710 includes a patterned metal layer 711 and an insulation layer 712 which collectively define the holes 710a.

Figure 12C:
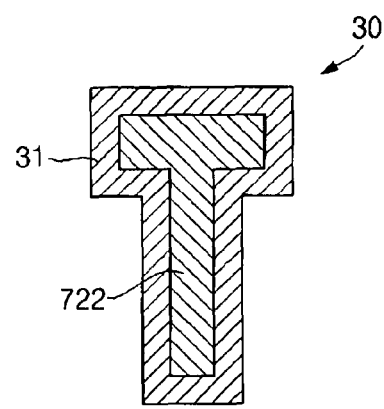

Referring to FIGS. 11 and 12C, a rivet 30 including an insulation film 31 and a land metal layer 722 is provided (S3). The rivet 30 has a little smaller diameter than that of each hole 710a of the substrate 710, and an upper portion of the rivet 30 has a larger diameter than that of each hole 710a. Accordingly, the rivet 30 may be fixed in a prescribed position when inserted into a respective one of the holes 710a.

Figure 12D:
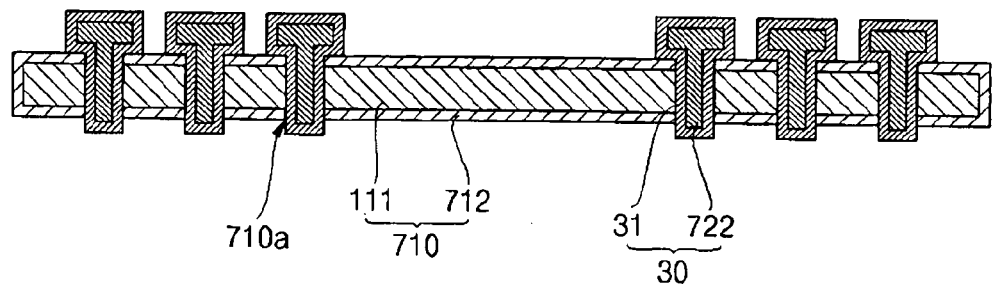

Referring to FIGS. 11 and 12D, the rivets 30 are inserted into respective ones of the holes 710a of the substrate 710 (S4). Each rivet 30 is inserted and fitted to a corresponding hole 710a of the substrate 710, and an upper portion of the rivet 30 is supported by the substrate 710 and fixed thereto.

Figure 12E:
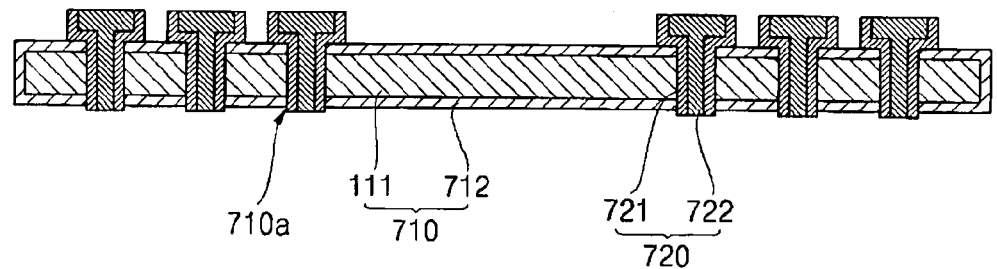

Referring to FIGS. 11 and 12E, the upper and lower surfaces of the rivet 30 are removed and an internal land metal layer 722 is exposed, thereby forming the land 720 (S5). In order to remove the upper and lower surfaces of the insulation film 31 originally surrounding the internal land metal layer 722, a process of grinding or etching may be performed. The upper and lower surfaces of the insulation film 31 are removed, the land metal layer 722 is exposed, thereby forming the land 720 which is capable of inputting and outputting electrical signals.

Figure 12F:
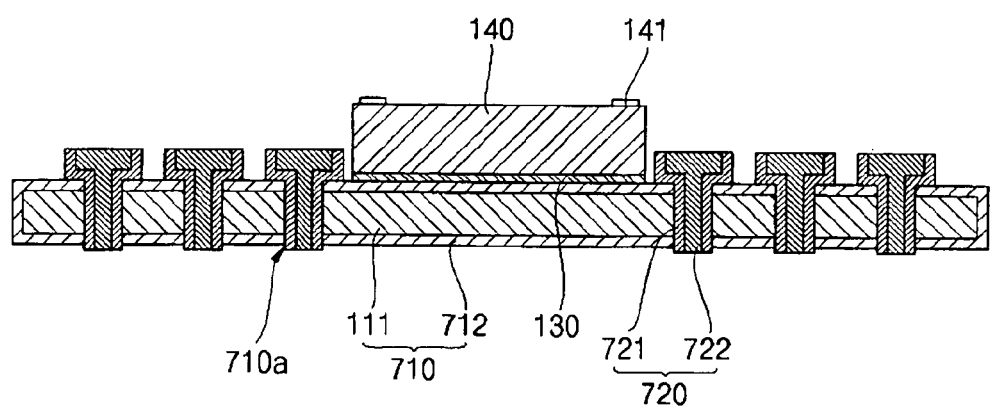

Referring to FIGS. 11 and 12F, the semiconductor die 140 is then attached to the upper portion of the substrate 710 (S6). The semiconductor die 140 is provided with a plurality of bond pads 141 in an upper portion of the semiconductor die 140 and attached to the substrate 710 through the adhesive 130 applied to a lower portion of the semiconductor die 140.

Figure 12G:
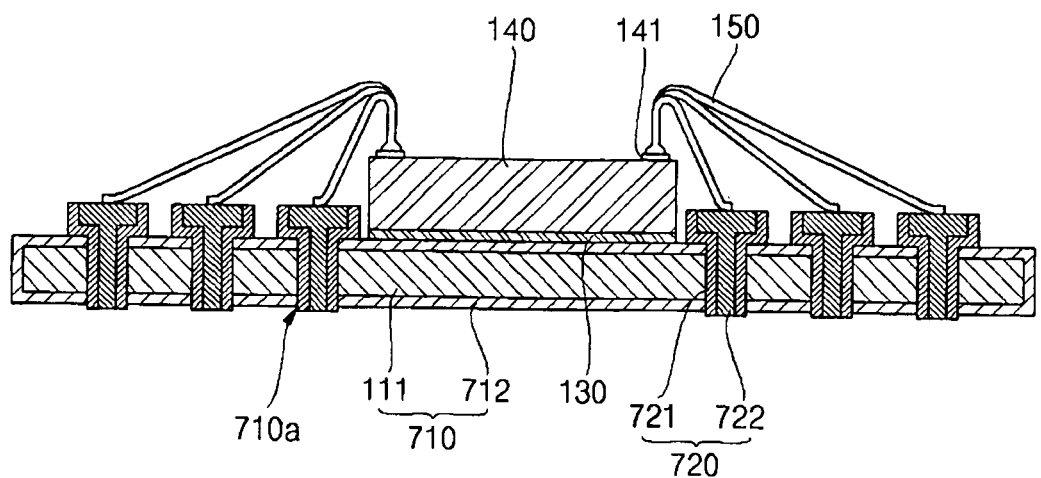

Referring to FIGS. 11 and 12G, the bond pads 141 of the semiconductor die 140 are electrically coupled to respective ones of the lands 720 using the conductive wires 150 (S7). Each conductive wire 150 may be formed by normal wire bonding that forms a ball bonding area on a respective one of the bond pads 141 of the semiconductor die 140, and forms a stitch bonding area on a respective one of the lands 720. Additionally, although not shown in the drawings, each conductive wire 150 may be formed by standoff stitch bonding that forms a ball bonding area on the land 720 and a stud bump on the bond pad 141, and connects them to each other.

Figure 12H:
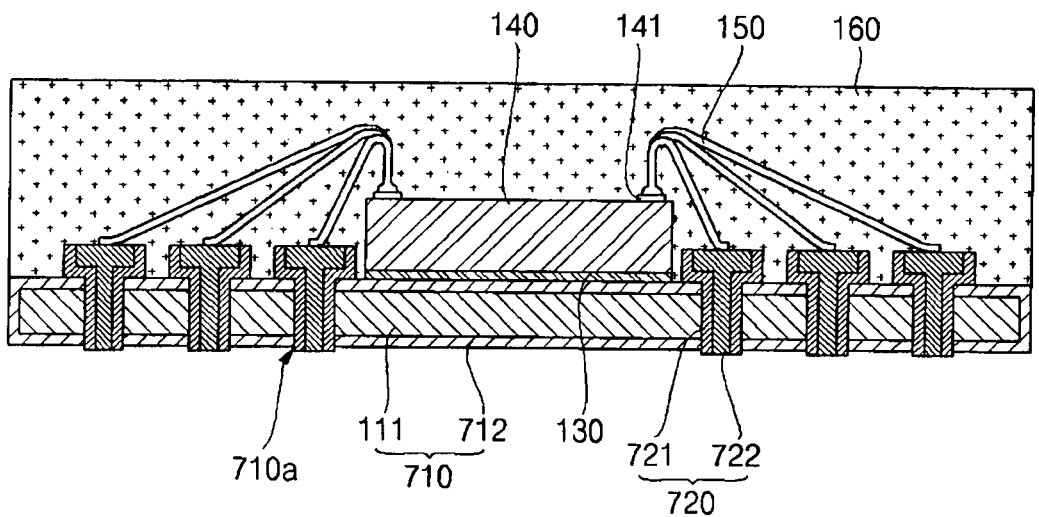

Referring to FIGS. 11 and 12H, the semiconductor die 140 and the conductive wire 150 are encapsulated by the encapsulant 160 (S8). The encapsulant also covers a portion of the substrate 710. The encapsulant 160 protects internal elements of the semiconductor package 700 and may be selected from one of epoxy resin, silicone resin or equivalent materials.

Figure 12I:
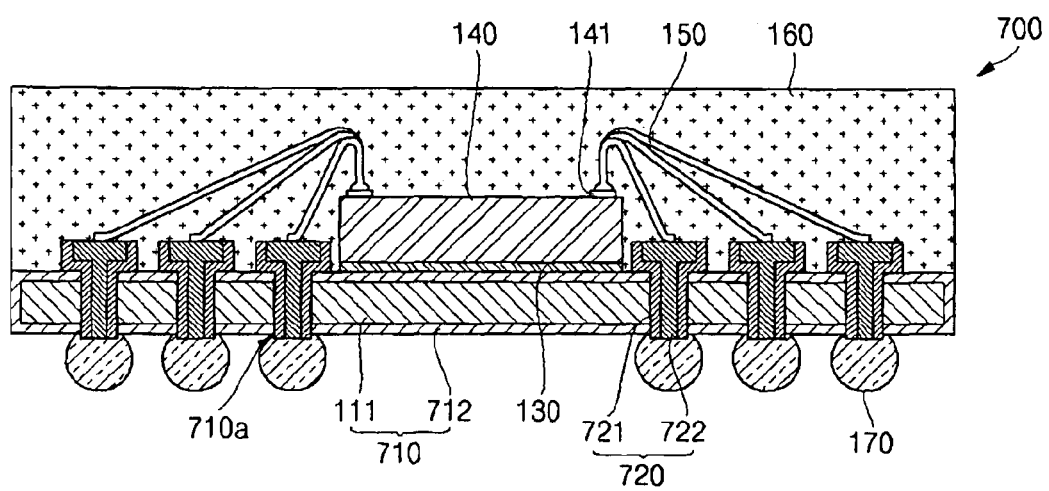

Referring to FIGS. 11 and 12I, the solder balls 710 are then attached to the lower portion of the substrate 710 (S9). The solder balls 170 are electrically connected to respective ones of the lands 720, and provide a path electrically coupling the semiconductor die 140 and an external circuit. Each solder ball 170 can be made of a metal alloy of tin (Sn), lead (Pb), silver (Ag) and the like.

As described above, the semiconductor package 700 is provided with the substrate 710 made of metal, which functions as a heatproof plate, thereby allowing the heat generated from the semiconductor die 140 to be dissipated easily to the outside, the substrate 710 also being less susceptible to warpage due to such heat, and further reducing the fabricating costs of the semiconductor package 700. Further, the lands 720 are each formed by a simplified fabrication process involving the use of the rivets 30 as described above.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and fabricating process, may be implemented by one skilled in the art in view of this disclosure.

What is claimed is:

1. A semiconductor package, comprising:
   a generally quadrangular substrate defining a central die mounting area and at least four peripheral edge segments, the substrate comprising a patterned metal layer and an insulation layer formed on at least a portion of the patterned metal layer, the substrate defining a plurality of holes which are segregated into at least four sets, the holes of each set being located between the central die mounting area and a respective one of the peripheral edge segments such that the holes of the sets are generally arranged in a pattern of concentric rings which at least partially circumvent the central die mounting area;
   a plurality of lands disposed within respective ones of the holes of the substrate;
   at least one semiconductor die mounted to the substrate:
   at least one electrical coupling member electrically connecting the semiconductor die to at least one of the lands; and
   an encapsulant covering at least the semiconductor die and the electrical coupling member.

2. The semiconductor package of claim 1, wherein the patterned metal layer is made of a metal alloy including at least one metal selected from the group consisting of copper, aluminum, and nickel.

3. The semiconductor package of claim 1, wherein the holes in the patterned metal layer are each internally coated by the insulation layer.

4. The semiconductor package of claim 1, wherein the insulation layer is made of an insulation resin.

5. The semiconductor package of claim 1, wherein each of the lands completely fills a corresponding one of the holes of the substrate.

6. The semiconductor package of claim 1, wherein the substrate further includes at least one penetration opening formed therein.

7. The semiconductor package of claim 6, the penetration opening is filled with the encapsulant.

8. The semiconductor package of claim 1, wherein the lands are arranged in a generally radial pattern which extends from the central die mounting area of the substrate.

9. The semiconductor package of claim 1, wherein the substrate is provided with at least one step so as to define an inner portion which is of a first thickness, a middle portion which circumvents the inner portion and is of a second thickness exceeding the first thickness, and a peripheral outer portion which circumvents the middle portion and is of a third thickness exceeding the second thickness.

10. The semiconductor package of claim 9, wherein the lands are segregated into multiple sets which are of differing heights and disposed within respective ones of the inner, middle and outer portions of the substrate.

11. The semiconductor package of claim 10, wherein the at least one semiconductor die comprises a plurality of stacked semiconductor dies mounted to the inner portion of the substrate and electrically connected to at least one of the lands of each of the sets thereof.

12. The semiconductor package of claim 1, wherein the substrate defines a peripheral portion of reduced thickness.

13. The semiconductor package of claim 12, wherein at least one lead is connected to the peripheral portion of the substrate, the lead protruding from the encapsulant.

14. The semiconductor package of claim 13, wherein the encapsulant covers a portion of the lead and effectively fixes the lead to the substrate.

15. The semiconductor package of claim 1, wherein a solder ball is electrically connected to each of the lands.

16. The semiconductor package of claim 1, further comprising:
   a rerouting film disposed on the substrate and electrically connected to the lands by an internal electrical path;
   the semiconductor die being mounted to the rerouting film, with at least some of the lands being located beneath the semiconductor die, the electrical coupling member electrically connecting the semiconductor die to the rerouting film, and the encapsulant covering the semiconductor die, the electrical coupling member, and a portion of the rerouting film.

17. A semiconductor package, comprising:
   a generally quadrangular substrate defining a central die mounting area and at least four peripheral edge segments, the substrate comprising a patterned metal layer and an insulation layer formed on at least a portion of the patterned metal layer, the patterned metal layer including a plurality of holes which are each internally coated by the insulation layer to collectively define a plurality of insulated holes in the substrate which are segregated into at least four sets, the insulated holes of each set being located between the central die mounting area and a respective one of the peripheral edge segments such that the insulated holes of the sets are generally arranged in a pattern of concentric rings which at least partially circumvent the central die mounting area;
   a plurality of lands disposed within respective ones of the insulated holes of the substrate;
   at least one semiconductor die mounted to the substrate;
   at least one electrical coupling member electrically connecting the semiconductor die to at least one of the lands; and
   an encapsulant covering the semiconductor die, the electrical coupling member, and a portion of the substrate.

18. The semiconductor package of claim 17, wherein each of the lands defines opposed ends which are exposed in and substantially flush with the insulation layer.

19. The semiconductor package of claim 17, wherein a solder ball is electrically connected to each of the lands.

20. A semiconductor package, comprising:
   a generally quadrangular substrate defining a central die mounting area and at least four peripheral edge segments, the substrate comprising a patterned metal layer including a plurality of holes formed therein, and an insulation layer which encapsulates the patterned metal layer and internally coats each of the holes thereof such that the patterned metal layer and the insulation layer collectively define a plurality of insulated holes in the substrate which are segregated into at least four sets, the insulated holes of each set being located between the central die mounting area and a respective one of the peripheral edge segments such that the insulated holes of the sets are generally arranged in a pattern of concentric rings which at least partially circumvent the central die mounting area;

a plurality of lands disposed within respective ones of the insulated holes of the substrate;

at least one semiconductor die mounted to the substrate;

at least one electrical coupling member electrically connecting the semiconductor die to at least one of the lands; and an encapsulant covering the semiconductor die, the electrical coupling member, and a portion of the substrate.

* * * * *